(12) United States Patent
Son et al.

(10) Patent No.: US 9,647,184 B2
(45) Date of Patent: May 9, 2017

(54) LIGHT EMITTING DEVICE PACKAGE AND LIGHTING APPARATUS INCLUDING THE SAME

(71) Applicant: LG INNOTEK CO., LTD., Seoul (KR)

(72) Inventors: Chang Gyun Son, Seoul (KR); Bo Ra Kang, Seoul (KR); Ki Cheol Kim, Seoul (KR); Sung Phil Kim, Seoul (KR); Kang Yeol Park, Seoul (KR); Yang Hyun Joo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/937,538

(22) Filed: Nov. 10, 2015

(65) Prior Publication Data

US 2016/0141472 A1   May 19, 2016

(30) Foreign Application Priority Data

Nov. 19, 2014 (KR) ........................ 10-2014-0161529

(51) Int. Cl.
*H01L 33/58* (2010.01)
*H01L 33/62* (2010.01)
*H01L 33/50* (2010.01)
*H01L 33/48* (2010.01)
*H01L 33/56* (2010.01)

(52) U.S. Cl.
CPC ............ *H01L 33/58* (2013.01); *H01L 33/483* (2013.01); *H01L 33/502* (2013.01); *H01L 33/505* (2013.01); *H01L 33/507* (2013.01); *H01L 33/508* (2013.01); *H01L 33/62* (2013.01); *H01L 33/56* (2013.01); *H01L 2224/48091* (2013.01)

(58) Field of Classification Search
CPC ....... H01L 33/58; H01L 33/507; H01L 33/62; H01L 33/508; H01L 33/505; H01L 33/502; H01L 33/483; H01L 33/56
USPC ........................................................... 257/98
See application file for complete search history.

(56) References Cited

U.S. PATENT DOCUMENTS

2011/0303940 A1* 12/2011 Lee .................... H01L 33/54
257/98
2013/0337591 A1 12/2013 Chen

FOREIGN PATENT DOCUMENTS

| CN | 202487663 U | 10/2012 |
|---|---|---|
| EP | 2383602 A2 | 11/2011 |
| JP | 2004-71908 A | 3/2004 |
| WO | 2014-006539 A1 | 1/2014 |

OTHER PUBLICATIONS

European Search Report (Appln. No. 15195382.5) dated Mar. 16, 2016.

* cited by examiner

*Primary Examiner* — Fernando L Toledo
*Assistant Examiner* — Adam S Bowen
(74) *Attorney, Agent, or Firm* — LRK Patent Law Firm

(57) ABSTRACT

A light emitting device package includes a package body, first and second lead frames located on the package body, a light source mounted on at least one of the first or second lead frames, a lens located on the package body, and a wavelength conversion unit partially located on the package body between the package body and the lens.

17 Claims, 29 Drawing Sheets

FIG. 11
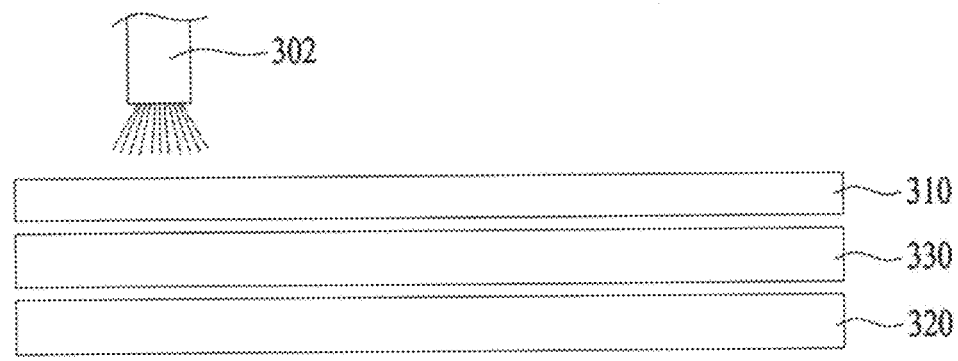
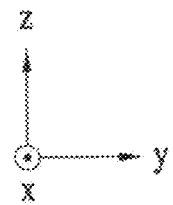

FIG. 12A
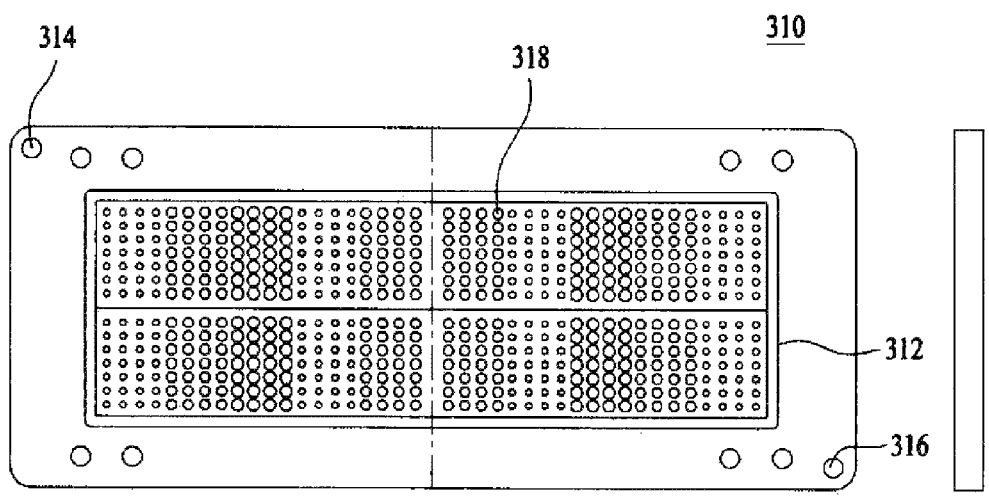
FIG. 12B
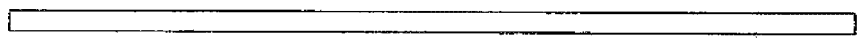
FIG. 12C

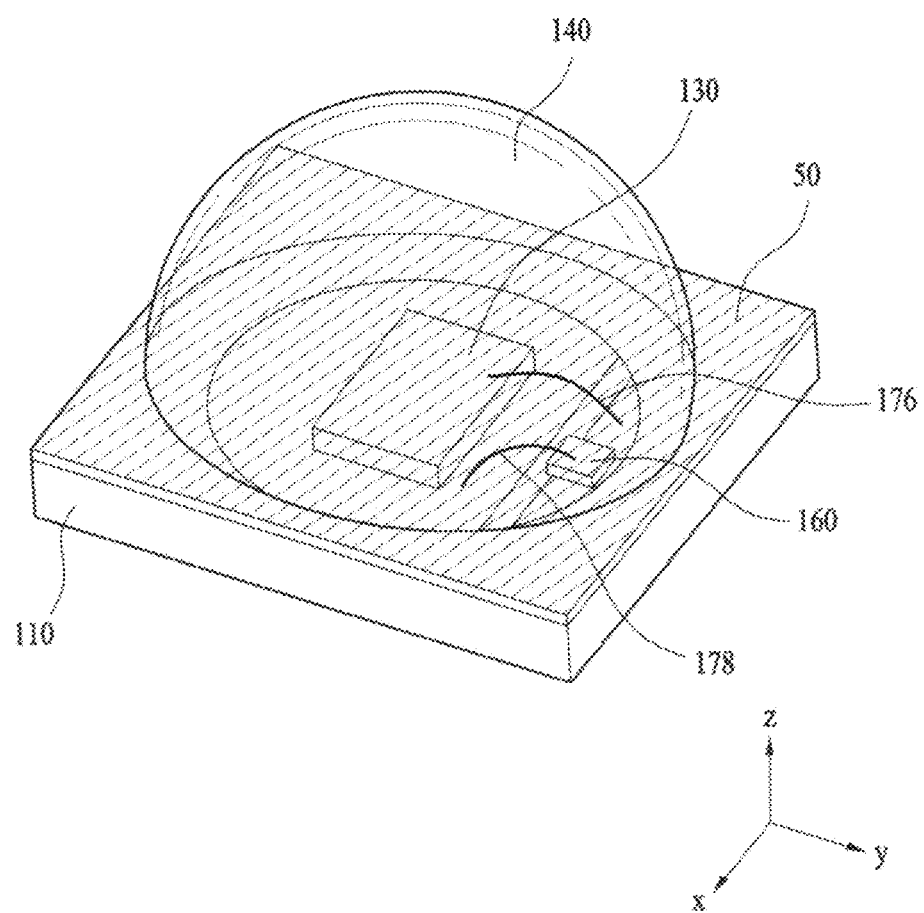

LIGHT EMITTING DEVICE PACKAGE AND LIGHTING APPARATUS INCLUDING THE SAME

CROSS REFERENCE TO RELATED APPLICATION

This application claims priority under 35 U.S.C. §119 to Korea Application No. 10-2014-0161529, filed on Nov. 19, 2014, which is hereby incorporated in its entirety by reference as if fully set forth herein.

BACKGROUND OF THE INVENTION

1. Field of the Invention

Embodiments relate to a light emitting device package and a lighting apparatus including the same.

2. Description of Related Art

A light emitting diode (LED) is a kind of semiconductor device that converts electricity into light for example infrared light, which is used as a light source, for signal transmission and reception, using the characteristics of a compound semiconductor.

A group III-V nitride semiconductor has been widely used as a core material for light emitting devices, such as light emitting diodes (LEDs) or laser diodes (LDs), thanks to the physical and chemical properties thereof.

LEDs do not contain any material that causes environmental pollution, such as mercury (Hg), which is used in conventional lighting apparatuses such as incandescent lamps and fluorescent lamps. Consequently, LEDs exhibit excellent environment-friendly characteristics. In addition, LEDs are characterized by a long lifespan and low power consumption. For these reasons, LEDs have replaced conventional light sources.

In a conventional light emitting device package including a light emitting device and a lens located on the light emitting device, color and illuminance may be non-uniform due to light that does not exit through the upper interface of the lens but is reflected into the interior of the lens.

SUMMARY

Embodiments provide a light emitting device package that exhibits uniform chroma and a lighting apparatus including the same.

En one embodiment, a light emitting device package includes a package body, first and second lead frames located on the package body, a light source mounted on at least one of the first or second lead frames, a lens located on the package body, and a wavelength conversion unit partially located on the package body between the package body and the lens.

The wavelength conversion unit may include a first segment located at the upper surface of the light source and a second segment extending from the first segment and located at the side surface of the light source.

The wavelength conversion unit may further include a third segment extending from the second segment and located between the package body and the lens.

The package body may include a cavity, in which the light source is mounted, and the third segment may be located on at least a portion of the bottom surface of the cavity excluding the side surface of the cavity.

The wavelength conversion unit may have at east one selected from among a circular planar shape, an oval planar shape, and a polygonal planar shape.

The light source may have an asymmetrical planar shape in a direction intersecting an optical axis. A minor-axis length of the wavelength conversion unit located in a minor-axis direction of the light source may be greater than a major-axis length of the wavelength conversion unit located in a major-axis direction of the light source.

The wavelength conversion unit may have a planar shape symmetric with respect to the optical axis.

A ratio of the area in which the wavelength conversion unit is actually located to the total area in which the wavelength conversion unit can be located may be equal to or greater than 0.1 and less than 1.

A ratio of a color distribution variation of the area in which the wavelength conversion unit is located to a color distribution variation of the total area in which the wavelength conversion unit can be located may be 0.001 to 0.8.

The color distribution variation may include a result obtained by subtracting the minimum value from the maximum value of correlated color temperature. Alternatively, the color distribution variation may include a result obtained by subtracting the minimum value from the maximum value of color coordinates.

The lens may include a lower recess for receiving at least a portion of the first and second segments and an upper recess for reflecting and refracting light emitted from the light source and transmitted through the wavelength conversion unit.

The wavelength conversion unit may be located so as to surround the light source.

The wavelength conversion unit may have a planar shape asymmetric with respect to the optical axis.

The wavelength conversion unit may include silicon.

The first to third segments may have the same thickness or different thicknesses.

In another embodiment, a light emitting device package includes a package body, a light source located on the package body, a lens located while surrounding the upper part and the side part of the light source, and a wavelength conversion unit located only between the upper part of the light source and the lens and between the side part of the light source and the lens.

In a further embodiment, a lighting apparatus includes the light emitting device package and an optical member located on the light emitting device package.

BRIEF DESCRIPTION OF THE DRAWINGS

Arrangements and embodiments may be described in detail with reference to the following drawings in which like reference numerals refer to like elements and wherein:

FIG. 11 is a partial process sectional view illustrating a method of manufacturing a wavelength conversion unit according to an embodiment;

FIGS. 12A to 12C are views illustrating an upper mask plate shown in FIG. 11;

FIG. 15 is a perspective view of the light emitting device package shown in FIG. 14;

DESCRIPTION OF SPECIFIC EMBODIMENTS

Figure 1:
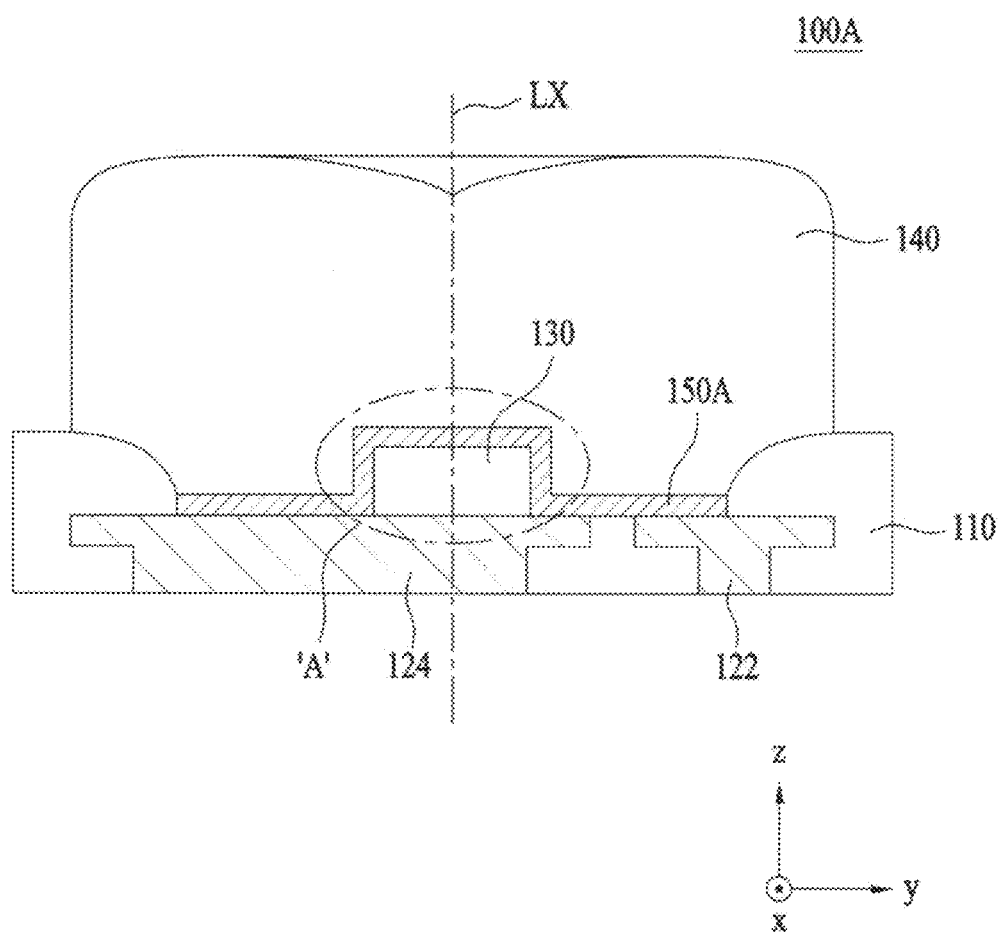
FIG. 1 is an assembled sectional view showing a light emitting device package according to an embodiment.

Reference will now be made in detail to the preferred embodiments, examples of which are illustrated in the accompanying drawings. However, embodiments may be modified into various other forms. Embodiments are not restrictive but are illustrative. Embodiments are provided to more completely explain the disclosure to a person having ordinary skill in the art.

It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

In addition, relational terms, such as 'first' and 'second' and 'upper part' and 'lower part', are used only to distinguish between one subject or element and another subject and element without necessarily requiring or involving any physical or logical relationship or sequence between such subjects or elements.

In the drawings, the thicknesses or sizes of respective layers (or respective parts) are exaggerated, omitted, or schematically illustrated for convenience and clarity of description. Further, the sizes of the respective elements do not denote the actual sizes thereof.

Hereinafter, light emitting device packages 100A to 100D and a lighting apparatus 400 according to embodiments will be described with reference to the accompanying drawings. For the sake of convenience, the light emitting device packages 100A to 100D and the lighting apparatus 400 will be described using a Cartesian coordinate system (x-axis, y-axis, z-axis). However, other different coordinate systems may be used. In the Cartesian coordinate system, the x-axis, the y-axis, and the z-axis are perpendicular to one another. However, the disclosure is not limited thereto. That is, the x-axis, the y-axis, and the z-axis may intersect one another without being perpendicular to one another.

Figure 2:
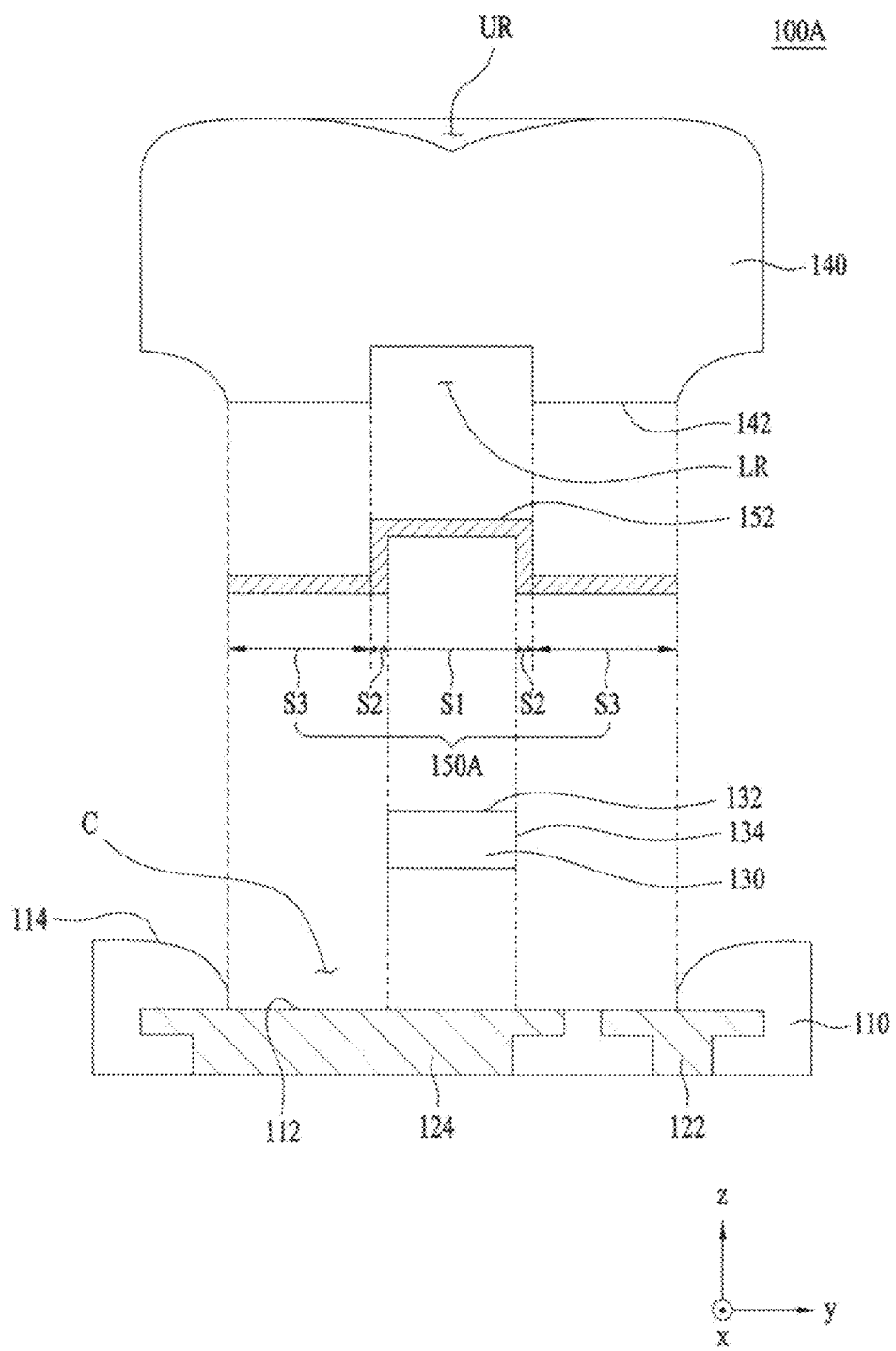
FIG. 2 is an exploded sectional view of the light emitting device package shown in FIG. 1.
Figure 3:
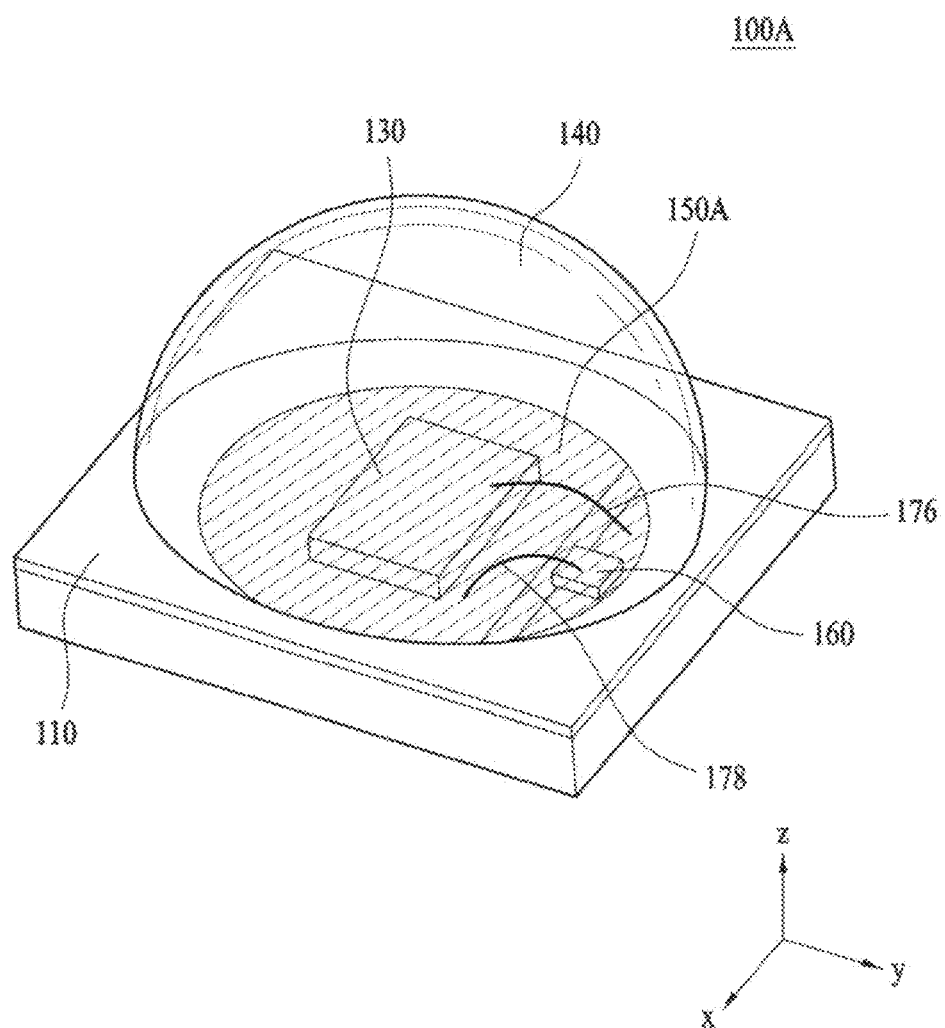
FIG. 3 is a perspective view showing an embodiment of the light emitting device package shown in FIG. 1.

FIG. 1 is an assembled sectional view showing a light emitting device package 100A according to an embodiment, FIG. 2 is an exploded sectional view of the light emitting device package 100A shown in FIG. 1, and FIG. 3 is a perspective view showing an embodiment of the light emitting device package 100A shown in FIG. 1.

The shape of the light emitting device package 100A shown in FIGS. 1 and 2 is not limited to the shape shown in FIG. 3. The light emitting device package 100A may have various shapes.

Referring to FIGS. 1 to 3, the light emitting device package 100A according to the embodiment may include a package body 110, first and second lead frames 122 and 124, a light source 130, a lens 140, and a wavelength conversion unit 150A.

The first and second lead frames 122 and 124 may be located on the package body 110. Referring to FIG. 2, the package body 110 may include a cavity C, in which the light source 130 is located. The light source 130 may be mounted on a bottom surface 112 of the cavity C.

The package body 110 may be made of a material including silicon, synthetic resin, or metal. In addition, as shown in FIG. 3, the light emitting device package 100A may further include a zener diode 160, which is not shown in FIGS. 1 and 2. The zener diode 160 may be located on the first lead frame 122, and may be electrically connected to the second lead frame 124 via a wire 178. According to circumstances, the zener diode 160 may be omitted. In the following description of light emitting device packages 100B to 100D according to embodiments, a description of the zener diode 160 will be omitted for the convenience of description.

The first and second lead frames 122 and 124 are electrically separated from each other. The first and second lead frames 122 and 124 serve to supply electric power to the light source 130. In addition, the first and second lead frames 122 and 124 may serve to reflect light emitted from the light source 130 in order to improve light efficiency, and may serve to discharge heat generated from the light source 140 to the outside.

The light source 130 may be mounted on at least one of the first or second lead frames 122 or 124. The light source 130 serves to emit light. The light source 130 may include at least one of a light emitting diode (LED) chip or a laser diode (LD) chip. However, the disclosure is not limited thereto. The LED chip may be a blue LED chip or an ultraviolet LED chip. Alternatively, the LED chip may be at least one selected from a red LED chip, a green LED chip, a blue LED chip, a yellow green LED chip, and a white LED chip or a combination thereof.

The light source 130 may be located to overlap the lens 140 in a direction of optical axis LX (i.e. a z-axis direction). However, the disclosure is not limited thereto. The light source 130 may be a top view type light emitting diode. Alternatively, the light source 130 may be a side view type light emitting diode.

In FIGS. 1 to 3, a single light source 130 is shown as being mounted on the package body 110. However, the disclosure is not limited thereto. That is, in another embodiment, a plurality of light sources 130 may be mounted on the package body 110.

The light source 130 may be electrically connected to the first lead frame 122 and/or the second lead frame 124 by wire bonding, flip-chip bonding, or die bonding. In the wire bonding, the light source 130 may have a horizontal bonding structure or a vertical bonding structure. However, the disclosure is not limited thereto the type of the light source.

Figure 4A:
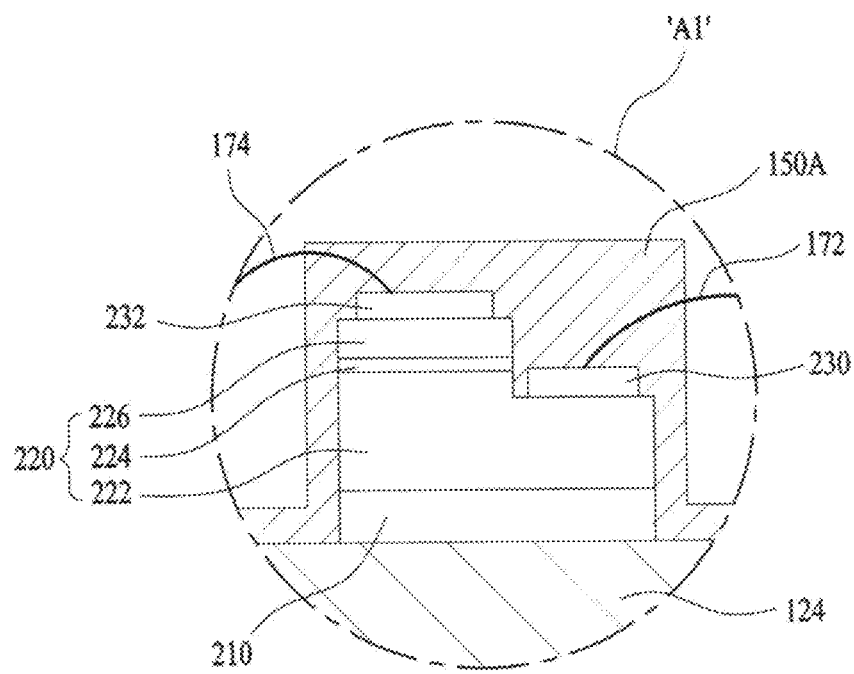
FIGS. 4A and 4B are partial sectional views showing embodiments of part 'A' shown in FIG. 1.
Figure 4B:
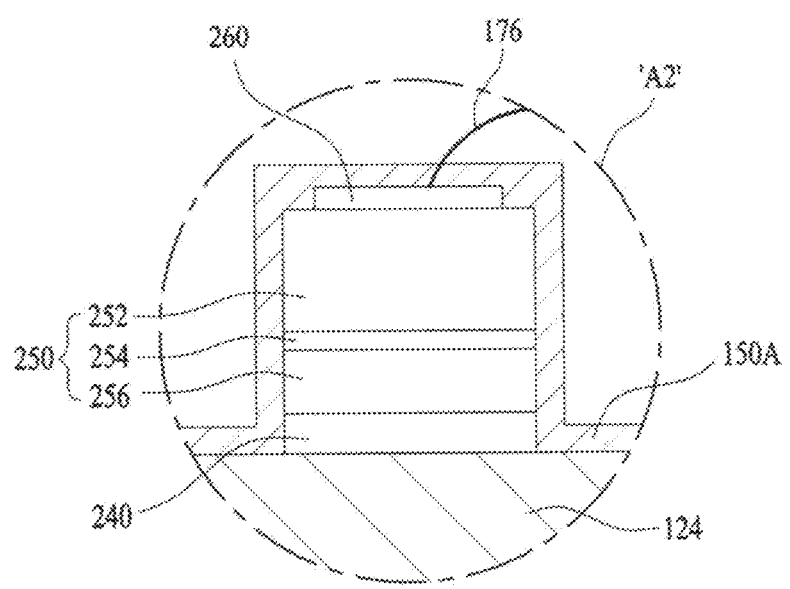

FIGS. 4A and 4B are partial sectional views showing embodiments A1 and A2 of part 'A' shown in FIG. 1.

In the embodiment A1 shown in FIG. 4A, the light source 130 may have a horizontal bonding structure. The light source 130 may include a substrate 210, a light emitting structure 220, and first and second electrodes 230 and 232.

The substrate 210 may be located on the second lead frame 124. The substrate 210 may be made of a conductive material or a non-conductive material. For example, the substrate 210 may be made of a material including at least one selected from among sapphire ($Al_2O_3$), GaN, SiC, ZnO, GaP, InP, $Ga_2O_3$, GaAs, and Si.

The light emitting structure 220 may be located on the substrate 210, and may include a first conductive semiconductor layer 222, an active layer 224, and a second conductive semiconductor layer 226.

The first conductive semiconductor layer 222 may be made of a group III-V or group II-VI compound semiconductor doped with a first conductive dopant. The first conductive semiconductor layer 222 may be doped with a first conductive dopant. In a case in which the first conductive semiconductor layer 222 is an n-type semiconductor layer, the first conductive dopant may be an n-type dopant, such as Si, Ge, Sn, Se, or Te. However, the disclosure is not limited thereto.

For example, the first conductive semiconductor layer 222 may be made of a semiconductor material having a chemical formula of $Al_xIn_yGa_{(1-x-y)}N$ (0≤x≤1, 0≤y≤1, 0≤x+y≤1). The first conductive semiconductor layer 222 may be made of a material including at least one selected from among GaN, InN, AlN, InGaN, AlGaN, InAlGaN, AlInN, AlGaAs, InGaAs, AlInGaAs, GaP, AlGaP, InGaP, AlInGaP, and InP.

The active layer 224 is located between the first conductive semiconductor layer 222 and the second conductive semiconductor layer 226. The active layer 224 is a layer that emits light having energy decided based on a unique energy band of a material constituting the active layer 224 by recombination of electrons (or holes) injected through the first conductive semiconductor layer 222 and holes (or electrons) injected through the second conductive semiconductor layer 226.

The active layer 224 may have at least one selected from among a single well structure, a multiple well structure, a single quantum well structure, a multiple quantum well (MQW) structure, a quantum wire structure, and a quantum dot structure.

A well layer/barrier layer of the active layer 224 may have a pair structure including at least one selected from among InGaN/GaN, InGaN/InGaN, GaN/AlGaN, InAlGaN/GaN, GaAs(InGaAs)/AlGaAs, and GaP(InGaP)/AlGaP. However, the disclosure is not limited thereto. The well layer may be made of a material having band gap energy lower than the band gap energy of the barrier layer.

A conductive clad layer (not shown) may be formed on the active layer 224 and/or under the active layer 224. The conductive clad layer may be made of a semiconductor having band gap energy higher than the band gap energy of the barrier layer of the active layer 224. For example, the conductive clad layer may include GaN, AlGaN, InAlGaN, or a superlattice structure. In addition, the conductive clad layer may be doped with an n-type or p-type dopant.

The second conductive semiconductor layer 226 may be made of a semiconductor compound. Specifically, the second conductive semiconductor layer 226 may be made of a group III-V or group II-VI compound semiconductor. For example, the second conductive semiconductor layer 226 may be made of a semiconductor material having a chemical formula of $In_xAl_yGa_{1-x-y}N$ (0≤x≤1, 0≤y≤1, 0≤x+y≤1). The second conductive semiconductor layer 226 may be doped with a second conductive dopant. In a case in which the second conductive semiconductor layer 226 is a p-type semiconductor layer, the second conductive dopant may be a p-type dopant, such as Mg, Zn, Ca, Sr, or Ba.

The first conductive semiconductor layer 222 may be an n-type semiconductor layer, and the second conductive semiconductor layer 226 may be a p-type semiconductor layer. Alternatively, the first conductive semiconductor layer 222 may be a p-type semiconductor layer, and the second conductive semiconductor layer 226 may be an n-type semiconductor layer.

The light emitting structure 220 may have any one selected from an n-p junction structure, a p-n junction structure, an n-p-n junction structure, and a p-n-p junction structure.

The first electrode 230 may be located on an exposed surface of the first conductive semiconductor layer 222, which is exposed by mesa-etching the second conductive semiconductor layer 226, the active layer 224, and a portion of the first conductive semiconductor layer 222. In addition, the second electrode 232 may be located on the second conductive semiconductor layer 226.

An ohmic contact layer (not shown) may be further located between the second electrode 232 and the second conductive semiconductor layer 226. The ohmic contact layer serves to improve ohmic characteristics of the second conductive semiconductor layer 226. In a case in which the second conductive semiconductor layer 226 is a p-type semiconductor layer, the concentration of a dopant doped in the second conductive semiconductor layer 226 is low, whereby contact resistance of the second conductive semiconductor layer 226 is high. As a result, ohmic characteristics of the second conductive semiconductor layer 226 are poor. The ohmic contact layer may serve to improve the ohmic characteristics of the second conductive semiconductor layer 226. For example, the ohmic contact layer may be made of a material including at least one selected from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ag, Ni, Cr, Ti, Al, Rh, Pd, Ir, Sn, In, Ru, Mg, Zn, Pt, Au, and Hf. However, the disclosure is not limited thereto.

The first electrode 230 and the second electrode 232 may be made of a material including at least one selected from among aluminum (Al), titanium (Ti), chrome (Cr), nickel (Ni), copper (Cu), and gold (Au), and may be formed to have a single layer or multiple layer structure The first electrode 230 may be electrically connected to the first lead frame 122 via a first wire 172, and the second electrode 232 may be electrically connected to the second lead frame 124 via a second wire 174.

The light source 130 is shown as being located on the second lead frame 124. However, the disclosure is not limited thereto. That is, in another embodiment, the light source 130 may be located on the first lead frame 122.

Meanwhile, as shown in FIG. 4B, the light source 130 may have a vertical bonding structure. The light source 130 may include a support substrate 240, a light emitting structure 250, and a first electrode 260.

The support substrate 240 may be located on the second lead frame 124. The support substrate 240 may be made of a conductive material or a non-conductive material. For example, the support substrate 240 may be made of a material including at least one selected from among sapphire ($Al_2O_3$), GaN, SiC, ZnO, GaP, InP, $Ga_2O_3$, GaAs, and Si. However, the disclosure is not limited thereto. In a case in which the support substrate 240 is made of a conductive material, the entire support substrate 240 may serve as a second electrode. To this end, the support substrate 240 may be made of a material exhibiting high electric conductivity. In addition, it is necessary for the support substrate 240 to sufficiently dissipate heat generated during the operation of the light source 130. To this end, the support substrate 240 may be made of a material exhibiting high thermal conductivity.

For example, the support substrate 240 may be made of a material selected from a group consisting of molybdenum (Mo), silicon (Si), tungsten (W), copper (Cu), and aluminum (Al) or an alloy thereof. In addition, the support substrate 240 may be made of a material selectively including gold (Au), copper alloy (Cu alloy), nickel (Ni), copper-tungsten (Cu—W), or a carrier wafer (e.g. GaN, Si, Ge, GaAs, ZnO, SiGe, SiC, SiGe, or $Ga_2O_3$).

Although not shown, at least one selected from a reflective layer and an ohmic layer may be further located between the support substrate 240 and the light emitting structure 250. The reflective layer may serve to reflect light emitted from the light emitting structure 250 upward, and may be located on the support substrate 240. For example, the reflective layer may be made of a metal layer including aluminum (Al), silver (Ag), nickel (Ni), platinum (Pt), rhodium (Rh), or an alloy including Al, Ag, Pt, or Rh. In addition, the reflective layer may also serve as the ohmic layer.

The light emitting structure 250 may be located on the support substrate 240, and may include a first conductive semiconductor layer 252, an active layer 254, and a second conductive semiconductor layer 256.

The second conductive semiconductor layer 256 may be made of a semiconductor compound. Specifically, the second conductive semiconductor layer 256 may be made of a group III-V or group II-VI compound semiconductor. For example, the second conductive semiconductor layer 256 may be made of a semiconductor material having a chemical formula of $In_xAl_yGa_{1-x-y}N$ ($0 \leq x \leq 1$, $0 \leq y \leq 1$, $0 \leq x+y \leq 1$). The second conductive semiconductor layer 256 may be doped with a p-type dopant, such as Mg, Zn, Ca, Sr, or Ba.

The active layer 254 is a layer that emits light having energy decided based on a unique energy band of a material constituting the active layer 254 by recombination of electrons (or holes) injected through the first conductive semiconductor layer 252 and holes (or electrons) injected through the second conductive semiconductor layer 256.

The active layer 254 may have at least one selected from among a single well structure, a multiple well structure, a single quantum well structure, a multiple quantum well (MQW) structure, a quantum wire structure, and a quantum dot structure.

A well layer/barrier layer of the active layer 254 may have a pair structure including at least one selected from among InGaN/GaN, InGaN/InGaN, GaN/AlGaN, InAlGaN/GaN, GaAs(InGaAs)/AlGaAs, and GaP(InGaP)/AlGaP. However, the disclosure is not limited thereto. The well layer may be made of a material having a band gap smaller than the band gap of the barrier layer.

A conductive clad layer (not shown) may be formed on the active layer 254 and/or under the active layer 254. The conductive clad layer may be made of a semiconductor having a band gap wider than the band gap of the barrier layer of the active layer 254. For example, the conductive clad layer may include GaN, AlGaN, InAlGaN, or a superlattice structure. In addition, the conductive clad layer may be doped with an n-type or p-type dopant.

The first conductive semiconductor layer 252 may be made of a group III-V or group II-VI compound semiconductor doped with a first conductive dopant. The first conductive semiconductor layer 252 may be doped with a first conductive dopant, such as Si, Ge, Sn, Se, or Te. However, the disclosure is not limited thereto.

For example, the first conductive semiconductor layer 252 may be made of a semiconductor material having a chemical formula of $Al_xIn_yGa_{(1-x-y)}N$ ($0 \leq x \leq 1$, $0 \leq y \leq 1$, $0 \leq x+y \leq 1$). The first conductive semiconductor layer 252 may be made of a material including at least one selected from among GaN, InN, AlN, InGaN, AlGaN, InAlGaN, AlInN, AlGaAs, InGaAs, AlInGaAs, GaP, AlGaP, InGaP, AlInGaP, and InP.

The first electrode 260 may be located on the first conductive semiconductor layer 252, and may be electrically connected to the first lead frame 122 via a wire 176.

In FIG. 4B, the light source 130 is shown as being located on the second lead frame 124. However, the disclosure is not limited thereto. That is, in another embodiment, the light source 130 may be located on the first lead frame 122.

Although not shown, the light source 130 may have a flip-chip bonding structure. In this case, the light source 130 may be directly and electrically connected to the first and second lead frames 122 and 124.

Hereinafter, the light source 130 shown in FIGS. 1 to 3 will be described as having a vertical bonding structure for the convenience of description. However, the following description may also be applied in a case in which the light source 130 has a horizontal bonding structure or a flip-chip bonding structure.

In addition, referring to FIG. 3, the light source 130 is shown as having a quadrangular planar shape. However, the disclosure is not limited thereto. That is, the light source 130 may have a polygonal, oval, or circular planar shape in addition to the quadrangular planar shape.

Meanwhile, the lens 140 may be located on the package body 110 for widening or narrowing a beam angle of light that is emitted from the light source 130 and passes through the wavelength conversion unit 150A. That is, the lens 140 may uniformalize color distribution of the light passing through the wavelength conversion unit 150A. Referring to FIG. 2, a lower surface 142 of the lens 140 may be located so as to abut on an upper surface 152 of the wavelength conversion unit 150A and an upper surface of the package body 110, i.e. a side surface 114 of the cavity C. However, the disclosure is not limited thereto. In another embodiment, although not shown, the lens 140 may be spaced apart from the wavelength conversion unit 150A in the direction of optical axis LX (i.e. the z-axis direction).

The lens 140 may have at least one selected from among a spherical shape, an aspherical shape, a freely curved shape, a polygonal shape such as a quadrangular shape, a hyperbolic shape, an oval shape, and a Fresnel lens shape. However, the disclosure is not limited thereto. The freely curved shape may be a shape having various curved surfaces.

In addition, the lens 140 may be made of a transparent material. For example, the lens 140 may be made of a material including at least one selected from among glass, silicon epoxy, $Al_2O_3$, PDMS, polycarbonate (PC), and acrylic resin such as polymethyl methacrylate (PMMA).

Meanwhile, the wavelength conversion unit 150A may be located between the package body 110 and the lens 140 for converting the wavelength of light emitted from the light source 130. When light emitted from the light source 130 passes through the wavelength conversion unit 150A, the wavelength of the light may be changed. However, all light beams transmitted through the wavelength conversion unit 150A may not be wavelength-converted light beams.

For example, the wavelength conversion unit 150A may be made of silicon (Si). The wavelength conversion unit 150A may be made of a material including at least one selected from among phosphor (or a fluorescent substance) such as ceramic phosphor, lumiphors, and YAG single-crystal. Lumiphors may be luminescent materials or a structure including the luminescent materials.

The fluorescent substance included in the wavelength conversion unit 150A may include any one selected from among a YAG fluorescent material, a TAG fluorescent material, a silicate fluorescent material, a sulfide fluorescent material, and a nitride fluorescent material, which are capable of converting light generated from the light source 130 into white light or light having desired correlated color temperature. However, the disclosure is not limited thereto.

As the YAG or TAG fluorescent material, any one may be selected from among $(Y, Tb, Lu, Sc, La, Gd, Sm)_3(Al, Ga, In, Si, Fe)_5(O, S)_{12}:Ce$. As the silicate fluorescent material, any one may be selected from among $(Sr, Ba, Ca, Mg)_2SiO_4:(Eu, F, Cl)$.

In addition, as the sulfide fluorescent material, any one may be selected from among $(Ca,Sr)S:Eu$, $(Sr,Ca,Ba)(Al, Ga)_2S_4:Eu$. As the nitride fluorescent material, any one may be selected from among $(Sr, Ca, Si, Al, O)N:Eu$ (e.g. $CaAlSiN_4:Eu$ $\beta$-SiAlON:Eu) and Ca-$\alpha$ SiAlON:Eu $(Ca_x, My)(Si,Al)_{12}(O,N)_{16}$ (where M is at least one selected from among Eu, Tb, Yb, and Er; $0.05<(x+y)<0.3$, $0.02<x<0.27$, and $0.03<y<0.3$).

A nitride fluorescent substance including N (e.g. $CaAlSiN_3:Eu$) may be used as a red fluorescent substance. The nitride red fluorescent substance exhibits higher resistance to external environment, such as heat and moisture, to have superior reliability and lower discoloration than the sulfide fluorescent substance.

When the wavelength conversion unit 150A includes a yellow phosphor, and blue light is emitted from the light source 130, white light may exit from the light emitting device package 100. However, the disclosure is not limited thereto. That is, when blue light is emitted from the light source 130, white light may exit from the light emitting device package 100A based on the kind of phosphor included in the wavelength conversion unit 150A. To this end, the wavelength conversion unit 150A may include a red phosphor and a green phosphor. Alternatively, the wavelength conversion unit 150A may include a yellow phosphor, a red phosphor, and a green phosphor.

In addition, the light source 130 and the wavelength conversion unit 150A may be variously embodied for the purpose of the light emitting device package 100A. When the light emitting device package 100A is used as a lamp, the light source 130 may emit light having an ultraviolet (UV) wavelength band, and the wavelength conversion unit 150A may include a red phosphor, a green phosphor, and a blue phosphor. Alternatively, when the light emitting device package 100A is used as a high color gamut display, the light source 130 may include a first light emitting device for emitting blue light, a second light emitting device for emitting green light, and a third light emitting device for emitting red light, and the wavelength conversion unit 150A may include a green phosphor, a blue phosphor, and a red phosphor.

In this embodiment, the wavelength conversion unit 150A may not be located over the entire, upper surface of the package body 110 but may be located on a portion of the upper surface of the package body 110.

Referring to FIG. 2, the wavelength conversion unit 150A may include first to third segments S1, S2, and S3. The first segment S1 is located at the upper surface of the light source 130. The second segment S2 extends from the first segment S1, and is located at the side surface of the light source 130. In addition, the third segment S3 extends from the second segment S2, and is located on the package body 110. For example, the third segment S3 may be located between the lower surface 142 of the lens 140 and the upper surface of the second lead frame 124.

In addition, the first to third segments S1 to S3 may have the same thickness or different thicknesses.

The third segment S3 may be located on at least a portion of the bottom surface 112 of the cavity C excluding the side surface 114 of the cavity C. For example, as shown in FIGS. 1 to 3, the third segment S3 may be located over the entire bottom surface 112 of the cavity C excluding the side surface 114 of the cavity C.

Referring to FIG. 2, the lens 140 may include a lower recess LR and an upper recess UR. However, the disclosure is not limited to a specific shape of the lens. The lower recess LR may have a sectional shape that is capable of receiving at least a portion of the first and second segments S1 and S2 and the light source 130. The upper recess UR may have a sectional shape that is suitable for reflecting and refracting light that is emitted from the light source 130 and transmitted through the wavelength conversion unit 150A.

Figure 5:
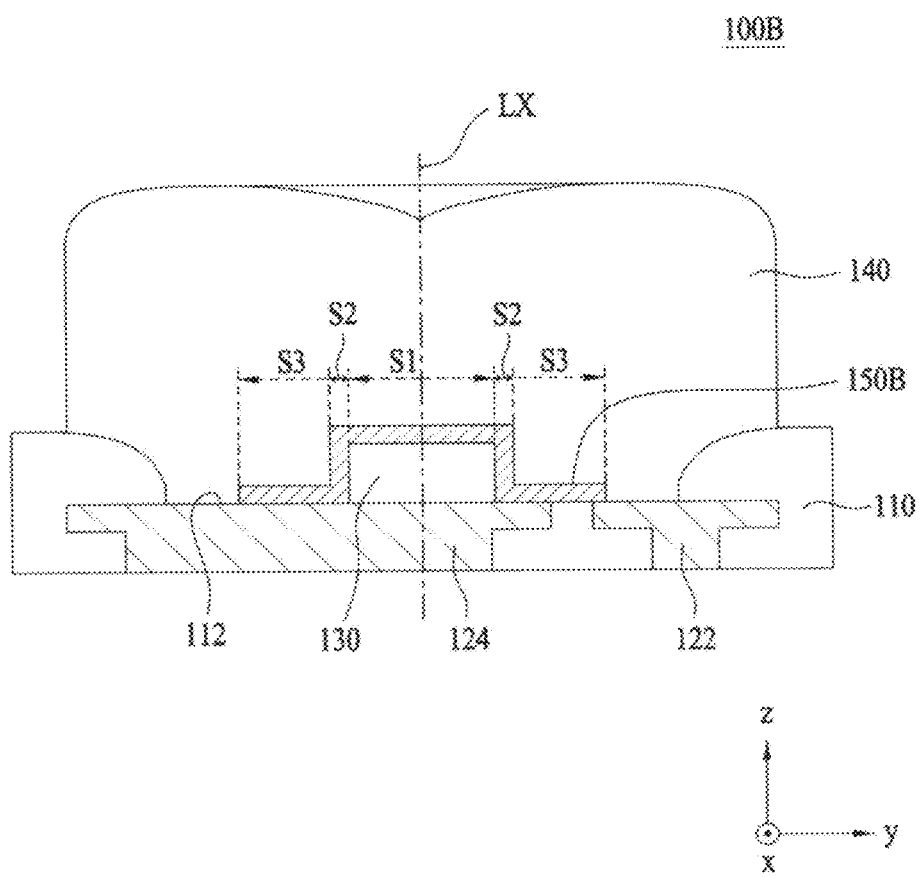
FIG. 5 is a sectional view showing a light emitting device package according to another embodiment.
Figure 6:
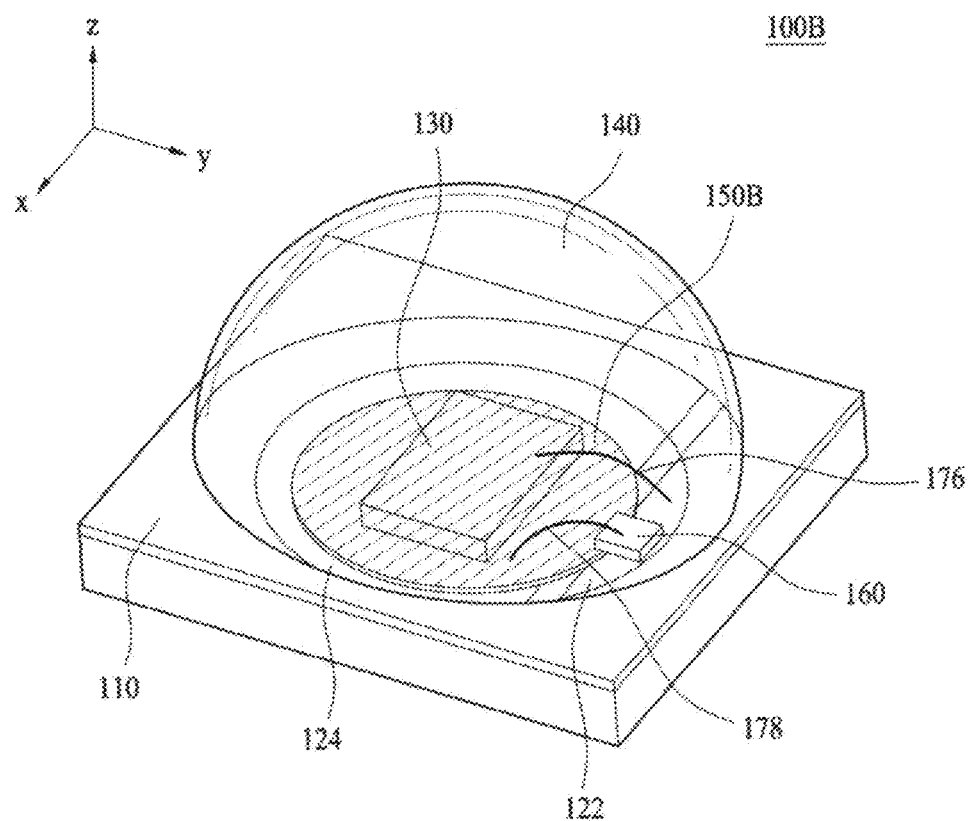
FIG. 6 is a perspective view showing an embodiment of the light emitting device package shown in FIG. 5.

FIG. 5 is a sectional view showing a light emitting device package 100B according to another embodiment, and FIG. 6 is a perspective view showing an embodiment of the light emitting device package 100B shown in FIG. 5.

The shape of the light emitting device package 100B shown in FIG. 5 is not limited to the shape shown in FIG. 6. The light emitting device package 100B may have various shapes.

Referring to FIGS. 5 and 6, the light emitting device package 100B may include a package body 110, first and second lead frames 122 and 124, a light source 130, a lens 140, and a wavelength conversion unit 150B. The package body 110, the first and second lead frames 122 and 124, the light source 130, and the lens 140 shown in FIGS. 5 and 6 are identical to the package body 110, the first and second lead frames 122 and 124, the light source 130, and the lens 140 shown in FIGS. 1 to 3, respectively. Therefore, the same reference numerals will be used, and a repetitive description thereof will be omitted.

In the same manner as the wavelength conversion unit 150A shown in FIGS. 1 to 3 includes the first to third segments S1 to S3, the wavelength conversion unit 150B shown in FIGS. 5 and 6 includes first to third segments S1 to S3. The third segment S3 shown in FIGS. 1 to 3 is located over the entire bottom surface 112 of the cavity C, whereas the third segment S3 shown in FIGS. 5 and 6 is located at a portion of the bottom surface 112 of the cavity C. Except for the differences described above, the light emitting device package 100B shown in FIGS. 5 and 6 is identical to the light emitting device package 100A shown in FIGS. 1 to 3, and therefore a repeated description thereof will be omitted.

Figure 7:
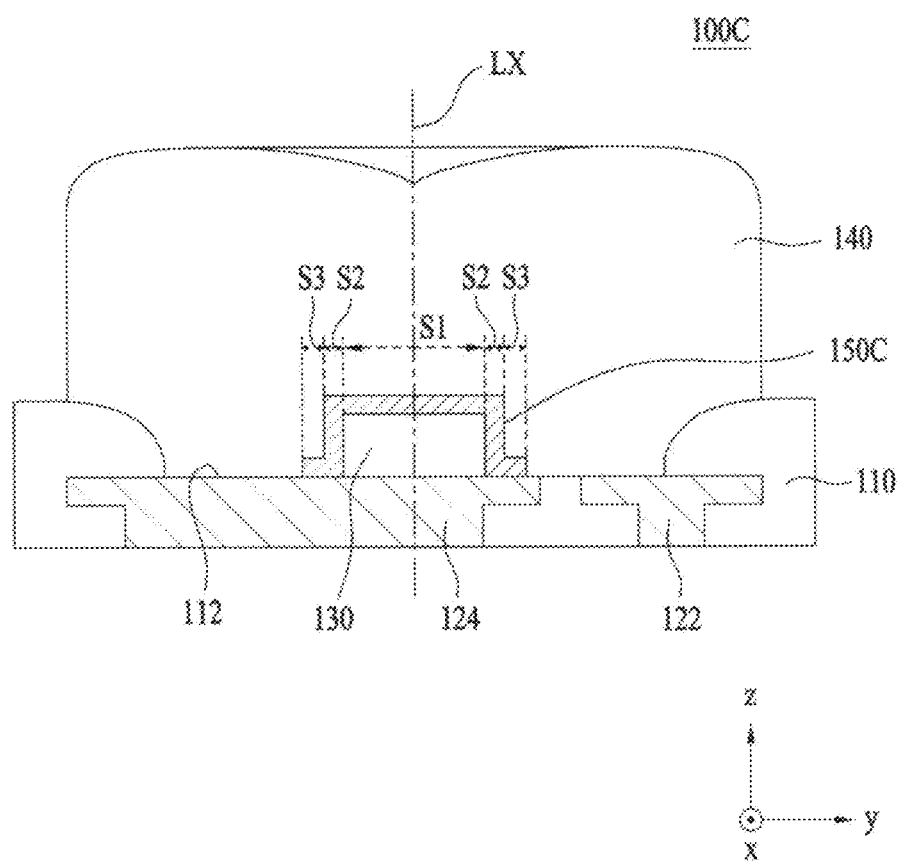
FIG. 7 is a sectional view showing a light emitting device package according to another embodiment.
Figure 8:
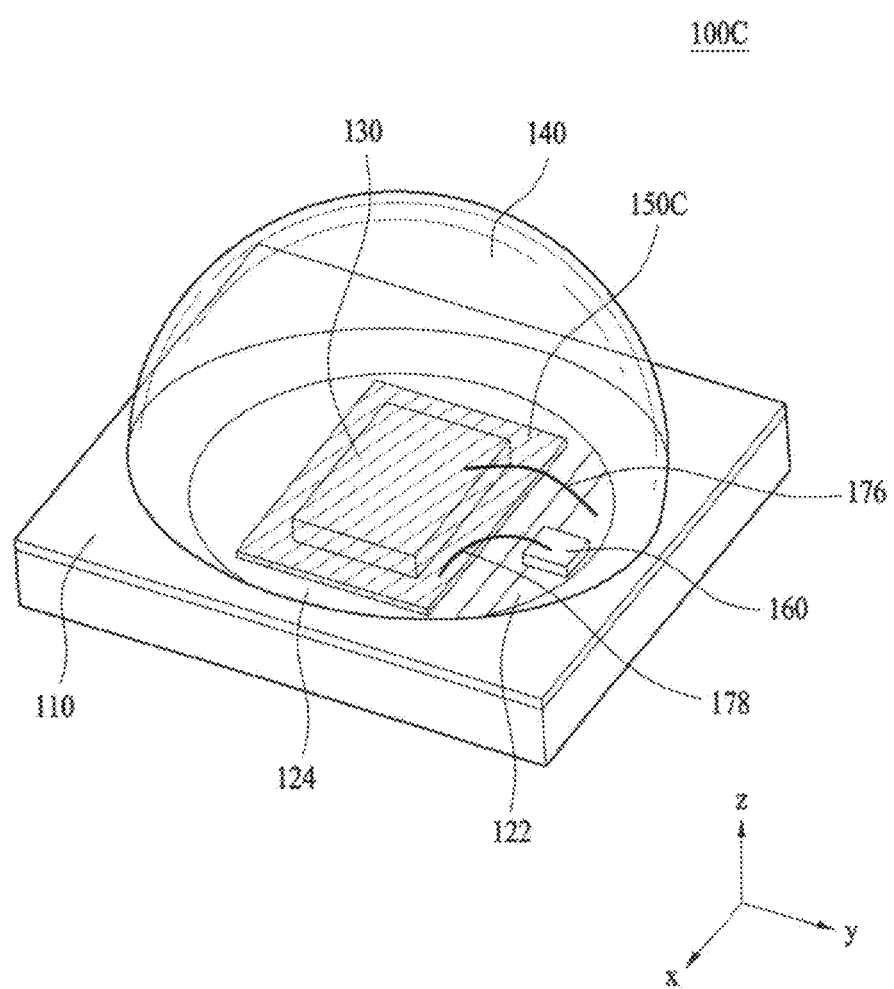
FIG. 8 is a perspective view showing an embodiment of the light emitting device package shown in FIG. 7.

FIG. 7 is a sectional view showing a light emitting device package 100C according to another embodiment, and FIG. 8 is a perspective view showing an embodiment of the light emitting device package 100C shown in FIG. 7.

The shape of the light emitting device package 100C shown in FIG. 7 is not limited to the shape shown in FIG. 8. The light emitting device package 100C may have various shapes.

Referring to FIGS. 7 and 8, the light emitting device package 100C may include a package body 110, first and second lead frames 122 and 124, a light source 130, a lens 140, and a wavelength conversion unit 150C. The package body 110, the first and second lead frames 122 and 124, the light source 130, and the lens 140 shown in FIGS. 7 and 8 are identical to the package body 110, the first and second lead frames 122 and 124, the light source 130, and the lens 140 shown in FIGS. 1 to 3, respectively. Therefore, the same reference numerals will be used, and a repetitive description thereof will be omitted.

In the same manner as the wavelength conversion unit 150A shown in FIGS. 1 to 3 includes the first to third segments S1 to S3, the wavelength conversion unit 150C shown in FIGS. 7 and 8 includes first to third segments S1 to S3. The third segment S3 shown in FIGS. 1 to 3 is located over the entire bottom surface 112 of the cavity C, whereas the third segment S3 shown in FIGS. 7 and 8 is located at a portion of the bottom surface 112 of the cavity C. Except for the differences described above, the light emitting device package 100C shown in FIGS. 7 and 8 is identical to the light emitting device package 100A shown in FIGS. 1 to 3, and therefore a repeated description thereof will be omitted.

In addition, the light emitting device packages 100A, 100B, and 100C shown respectively in FIGS. 3, 6, and 8 may have a circular planar shape or a quadrangular planar shape. The light emitting device packages 100A and 100B shown respectively in FIGS. 3 and 6 are located over the first and second lead frames 122 and 124, whereas the light emitting device package 100C shown in FIG. 3 are located on only the second lead frame 124. Except for the differences described above, the light emitting device package 100C shown in FIGS. 7 and 8 is identical to the light emitting device package 100B shown in FIGS. 5 and 6.

Figure 9:
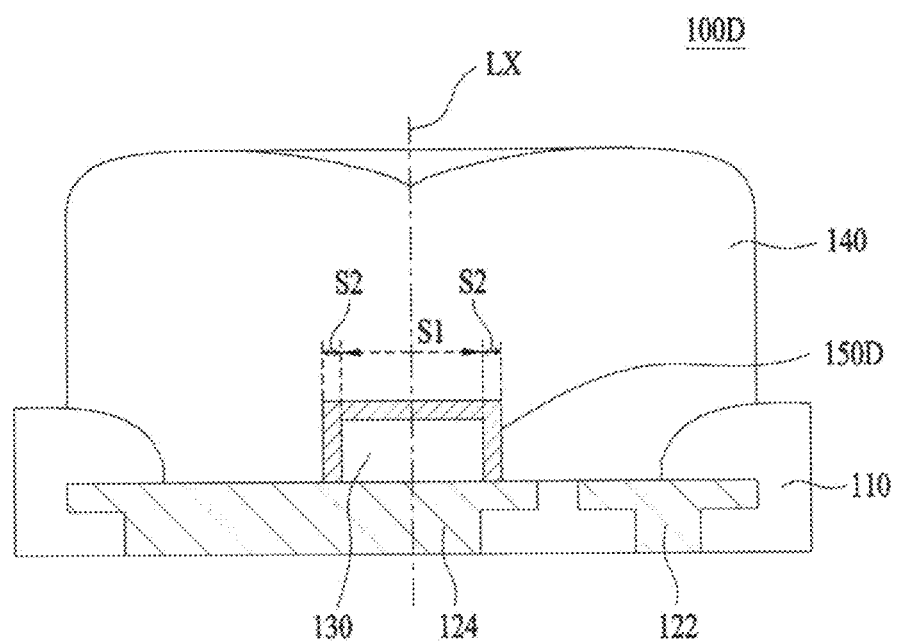
FIG. 9 is a sectional view showing a light emitting device package according to a further embodiment.
Figure 10:
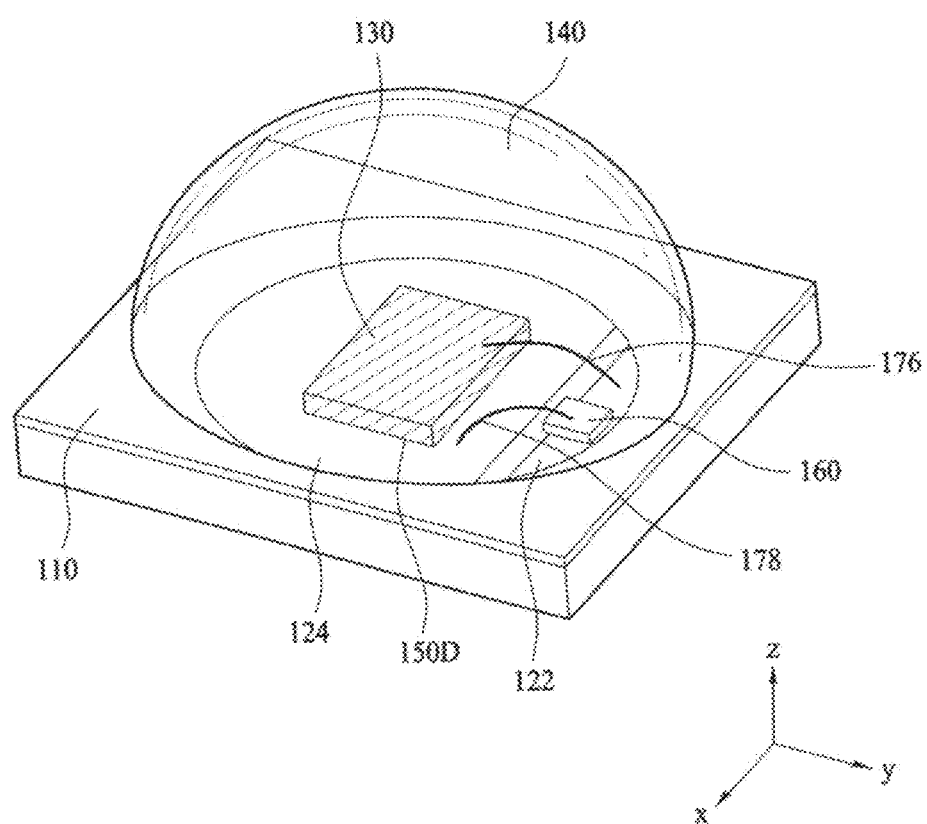
FIG. 10 is a perspective view showing an embodiment of the light emitting device package shown in FIG. 9.

FIG. 9 is a sectional view showing a light emitting device package 100D according to a further embodiment, and FIG. 10 is a perspective view showing an embodiment of the light emitting device package 100D shown in FIG. 9.

The shape of the light emitting device package 100D shown in FIG. 9 is not limited to the shape shown in FIG. 10. The light emitting device package 100D may have various shapes.

Referring to FIGS. 9 and 10, the light emitting device package 100D may include a package body 110, first and second lead frames 122 and 124, a light source 130, a lens 140, and a wavelength conversion unit 150D. The package body 110, the first and second lead frames 122 and 124, the light source 130, and the lens 140 shown in FIGS. 9 and 10 are identical to the package body 110, the first and second lead frames 122 and 124, the light source 130, and the lens 140 shown in FIGS. 1 to 3, respectively. Therefore, the same reference numerals will be used, and a repetitive description thereof will be omitted.

The wavelength conversion unit 150A of the light emitting device package 100A shown in FIGS. 1 to 3 includes the first to third segments S1 to S3, whereas the wavelength conversion unit 150D shown in FIGS. 9 and 10 includes only first and second segments S1 and S2. Except for the differences described above, the light emitting device package 100D shown in FIGS. 9 and 10 is identical to the light emitting device package 100A shown in FIGS. 1 to 3. Therefore, the same reference numerals will be used, and a repetitive description thereof will be omitted.

In addition, the wavelength conversion units 150A and 150B of the light emitting device packages 100A and 100B shown respectively in FIGS. 3 and 6 have a circular planar shape, and the wavelength conversion units 150C and 150D shown respectively in FIGS. 8 and 10 have a quadrangular planar shape. However, the disclosure is not limited thereto. That is, in another embodiment, the wavelength conversion units 150A to 150D may have an oval planar shape or a polygonal planar shape other than the quadrangular planar shape. Alternatively, the wavelength conversion units 150A to 150D may have a combination of the circular planar shape, the oval planar shape, and the polygonal planar shape.

In addition, in the light emitting device packages 100A, 100B, 100C, and 100D shown respectively in FIGS. 3, 6, 8, and 10, the light source 130 has a rectangular planar shape. However, the disclosure is not limited thereto. That is, in another embodiment, the light source 130 may have a square planar shape. In a case in which the light source 130 has a rectangular planar shape, a horizontal-axis side of the rectangular planar shape may be longer or shorter than a vertical-axis side of the rectangular planar shape. Hereinafter, a direction in which the longer side is located will be referred to as a major-axis direction, and a direction in which the shorter side is located will be referred to as a minor-axis direction.

For example, referring to FIGS. 3, 6, 8, and 10, the length of the light source 130 in the major-axis direction, i.e. the x-axis direction, is the major-axis length, and the length of the light source 130 in the minor-axis direction, i.e. the y-axis direction, is the minor-axis length. In a case in which the major-axis length and the minor-axis length of the light source 130 are different from each other, a beam angle of light exiting upward from the light source 130 on the major axis may be different from a beam angle of light exiting upward from the light source 130 on the minor axis. In order to solve this problem, in these embodiments, the minor-axis length of the wavelength conversion units 150A to 150D located in the minor-axis direction of the light source 130, i.e. the y-axis direction, may be greater than the major-axis length of the wavelength conversion units 150A to 150D located in the major-axis direction of the light source 130, i.e. the x-axis direction. That is, the light source 130 may have an asymmetrical planar shape in directions (e.g. the x-axis and y-axis directions, which are perpendicular to the optical axis LX) intersecting the optical axis LX. In a case in which the length of the wavelength conversion units 150A to 150D in the minor-axis direction of the light source 130, i.e. the y-axis direction, is greater than the length of the wavelength conversion units 150A to 150D in the major-axis direction of the light source 130, i.e. the x-axis direction, as ax described above, it is possible to obtain an effect as if the symmetrical light source 130 having the same minor-axis and major-axis lengths were used in spite of using the asymmetrical light source 130 having different minor-axis and major-axis lengths.

In addition, as shown in FIGS. 1 to 10, the wavelength conversion units 150A to 150D of the light emitting device packages 100A to 100D may have a planar shape that is symmetric with respect to the optical axis LX. That is, the wavelength conversion units 150A to 150D may be symmetric with respect to the direction of optical axis LX, i.e. the z-axis direction, in at least one of the y-axis direction or the x-axis direction. However, the disclosure is not limited thereto. That is, in other embodiments, the wavelength conversion units 150A to 150D may have a planar shape that is asymmetric with respect to the direction of optical axis LX, i.e. the z-axis direction.

In addition, the wavelength conversion units 150A to 150D may serve not only to convert the wavelength band of light emitted from the light source 130 but also to surround the light source 130.

The wavelength conversion units 150A to 150D may be formed by globally deposition, spraying, or injection, on the package body 110, in various ways such as spray coating, dispensing, conformal coating, and phosphor shell.

Hereinafter, a method of manufacturing the wavelength conversion unit 150A of the light emitting device package 100A shown in FIGS. 1 to 3 by spray coating will be described with reference to the accompanying drawings. The wavelength conversion units 150B to 150D shown in FIGS. 4 to 10 may be manufactured using the same method.

FIG. 11 is a partial process sectional view illustrating a method of manufacturing the wavelength conversion unit 150A according to an embodiment.

Referring to FIG. 11, an upper mask plate 310 is located on a lead frame 330, and a lower mask plate 320 is located under the lead frame 330. A light source 130 is arrayed on the lead frame 330. The lead frame 330 may be the first and second lead frames 122 and 124 shown in FIGS. 1 to 3.

FIGS. 12A to 12C are views illustrating the upper mask plate 310 shown in FIG. 11. FIG. 12A is a plan view of the upper mask plate 310 when viewed in a positive z-axis direction, FIG. 12B is a sectional view of the upper mask plate 310 when viewed in a positive y-axis direction, and FIG. 12C is a sectional view of the upper mask plate 310 when viewed in a positive x-axis direction.

Referring to FIGS. 12A to 12C, the upper mask plate 310 may include a fluorescent substance injection region 312 and a plurality of alignment marks 314 and 316.

The fluorescent substance injection region 312 may be a portion of the lead frame 330 at which the light source 130 is arrayed. In addition, the fluorescent substance injection region 312, which is a region where a fluorescent substance is injected, may include a plurality of through holes 318. As shown, the through holes 318 may have a circular planar shape. However, the disclosure is not limited to a specific planar shape of the through holes. The through holes 318 having the circular planar shape may have different sizes in order to change the area on which the fluorescent substance is deposited. However, the disclosure is not limited thereto.

Figure 13A:
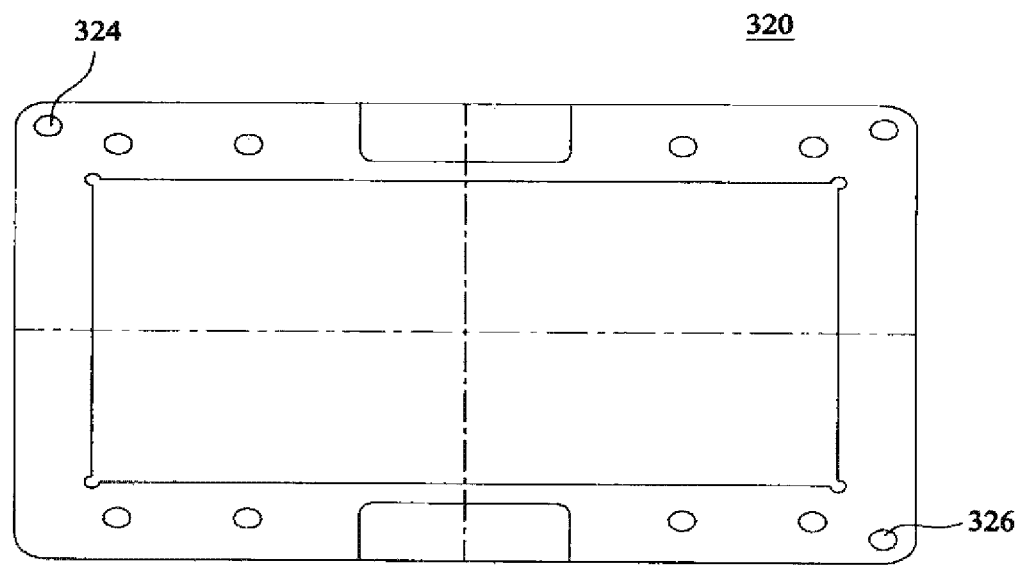
FIGS. 13A and 13B are views illustrating a lower mask plate shown in FIG. 11.
Figure 13B:

FIGS. 13A and 13B are views illustrating the lower mask plate 320 shown in FIG. 11. FIG. 13A is a bottom view of the lower mask plate 320 when viewed in a negative z-axis direction, and FIG. 13B is a sectional view of the lower mask plate 320 when viewed in a negative x-axis direction.

Referring to FIG. 13A, the lower mask plate 320 may include a plurality of alignment marks 324 and 326.

The upper mask plate 310 and the lower mask plate 320 may aligned and coupled to each other using the alignment marks 314, 316, 324, and 326 shown in FIGS. 12A and 13A.

Referring back to FIG. 11, when a fluorescent substance is sprayed from a fluorescent substance injection unit 302 in a state in which the upper mask plate 310 and the lower mask plate 320 are located respectively on and under the lead frame 330, on which the light source 130 is arrayed, the fluorescent substance may be coated on the lead frame 330 through the through holes 318 of the upper mask plate 310. As a result, a wavelength conversion unit 150A may not be deposited on the entire upper surface of the package body 110, but may be selectively deposited on a portion of the upper surface of the package body 110.

Subsequently, the upper mask plate 310 and the lower mask plate 320 are separated from the lead frame 330, and then, the lead frame 330, on which the fluorescent substance is coated, is cured, and then, the lead frame 330 is cleaned using plasma, whereby a wavelength conversion unit 150A may be formed. Subsequently, a lens 140 is molded on a structure on which the wavelength conversion unit 150A is formed. As a result, the light emitting device package 100A shown in FIGS. 1 to 3 may be finally manufactured.

Hereinafter, the light emitting device packages 100A to 100D according to the previous embodiments and a light emitting device package according to a comparative example will be described with reference to the accompanying drawings.

Figure 14:
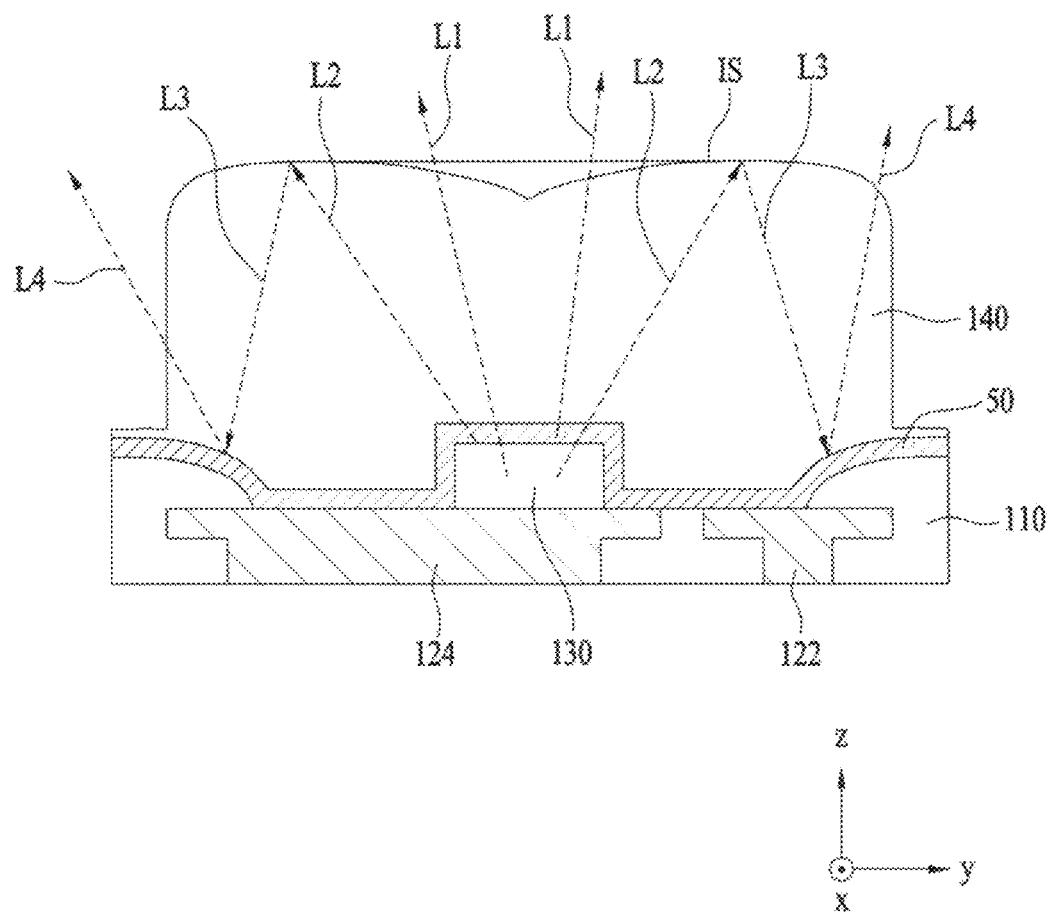
FIG. 14 is a sectional view showing a light emitting device package according to a comparative example.

FIG. 14 is a sectional view showing a light emitting device package according to a comparative example, and FIG. 15 is a perspective view of the light emitting device package according to the comparative example shown in FIG. 14.

Referring to FIGS. 14 and 15, the light emitting device package according to the comparative example includes a package body 110, first and second lead frames 122 and 124, a light source 130, a lens 140, and a wavelength conversion unit 50. It is assumed that the package body 110, the first and second lead frames 122 and 124, the light source 130, and the lens 140 shown in FIGS. 14 and 15 are identical to the package body 110, the first and second lead frames 122 and 124, the light source 130, and the lens 140 shown in FIG. 2, respectively. In addition, it is assumed that the wavelength conversion unit 50 performs the same function as the wavelength conversion unit 150A shown in FIGS. 2 and 3.

The wavelength conversion unit 50 of the light emitting device package according to the comparative example shown in FIGS. 14 and 15 is located at the entire upper surface of the package body 110, unlike the wavelength conversion units 150A to 150D of the light emitting device packages 100A to 100D according to the previous embodiments shown in FIGS. 1 to 10. That is, the wavelength conversion unit 50 shown in FIGS. 14 and 15 is located at the bottom surface 112 and the side surface 114 of the cavity C of the package body 110. In this case, in the light emitting device package according to the comparative example shown in FIGS. 14 and 15, light L1 transmitted through the wavelength conversion unit 50 may escape to the air through an interface IS between the lens 140 and the air. However, a portion L2 of the light transmitted through the wavelength conversion unit 50 may not escape to the air through the interface IS, but may be reflected to the interior of the lens 140. Both light converted by the wavelength conversion unit 50 and light not converted by the wavelength conversion unit 50 may be reflected at the interface IS. Light L3 reflected to the interior of the lens 130 may be again transmitted through the wavelength conversion unit 50, and may escape through the interface IS as new light L4.

The light L3 reflected at the interface IS instead of the light L1 emitted from the light source 130 may badly affect the lens 140. As a result, color and illuminance may be non-uniform.

In consideration of this, the area in which the wavelength conversion units 150A to 150D are located in the light emitting device packages 100A to 100D according to the embodiments is smaller than the area in which the wavelength conversion unit 50 is located in the light emitting device package according to the comparative example. As a result, the number of times when the reflected light L3 collides with the wavelength conversion units 150A to 150D may be reduced, whereby non-uniformity in color and non-uniformity in illuminance may be solved. That is, in the light emitting device packages 100A to 100D according to the embodiments, the wavelength conversion units 150A to 150D are effectively deposited in order to adjust a beam angle of light that is emitted from the light source 130 and exits through the lens 140, thereby achieving uniform illuminance.

In the light emitting device packages 100A to 100D, a ratio of the actual area in which the wavelength conversion units 150A to 150D are actually located to the total area in which the wavelength conversion units 150A to 150D can be located may be equal to or greater than 0.1 and less than 1. The total area in which the wavelength conversion units 150A to 150D can be located may be the area in which the wavelength conversion unit 50 is located in the light emitting device package according to the comparative example as shown in FIGS. 14 and 15. For example, referring to FIG. 2, the total area in which the wavelength conversion units 150A to 150D can be located may be the sum of the area (or upper area) of the upper surface 132 of the light source 130, the area (or side area) of the side surface 134 of the light source 130, the area (or bottom area) of the bottom surface 112 of the cavity C that is not covered by the light source 130 but is exposed, and the area (or side area) of the side surface 114 of the cavity C.

The area in which the wavelength conversion units 150A to 150D are actually located may be the 'light emitting area.' Illuminance distribution of light exiting from the light emitting device packages 100A to 100D may be changed based on the light emitting area.

FIGS. 16A to 21C are views exemplarily showing illuminance distribution based on the size and position of the light emitting area.

Figure 16A:
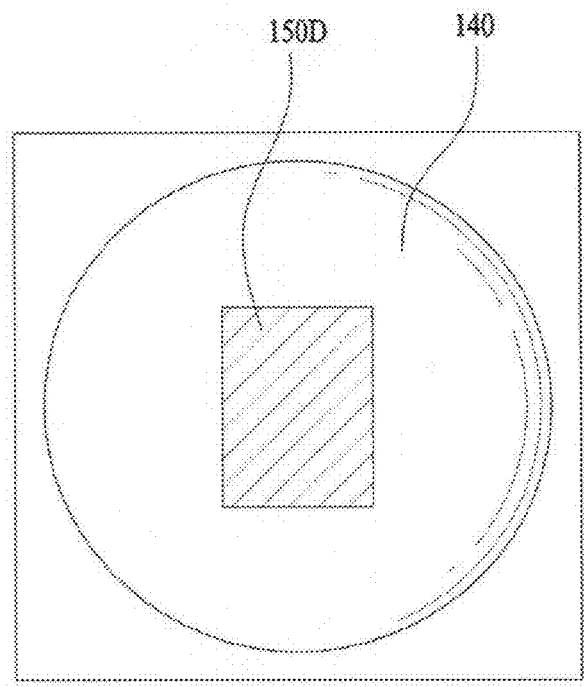
FIGS. 16A to 16C are views exemplarily showing illuminance distribution based on the size and position of the light emitting area according to an embodiment.
Figure 17A:
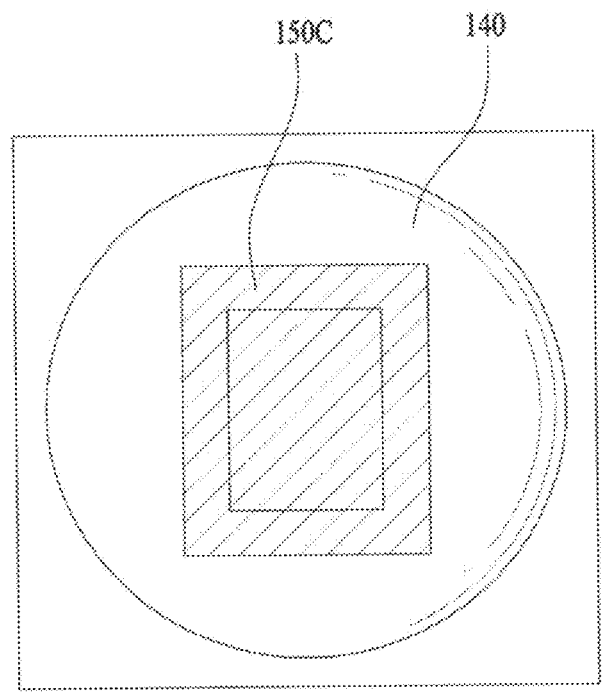
FIGS. 17A to 17C are views exemplarily showing illuminance distribution based on the size and position of the light emitting area according to another embodiment.
Figure 19A:
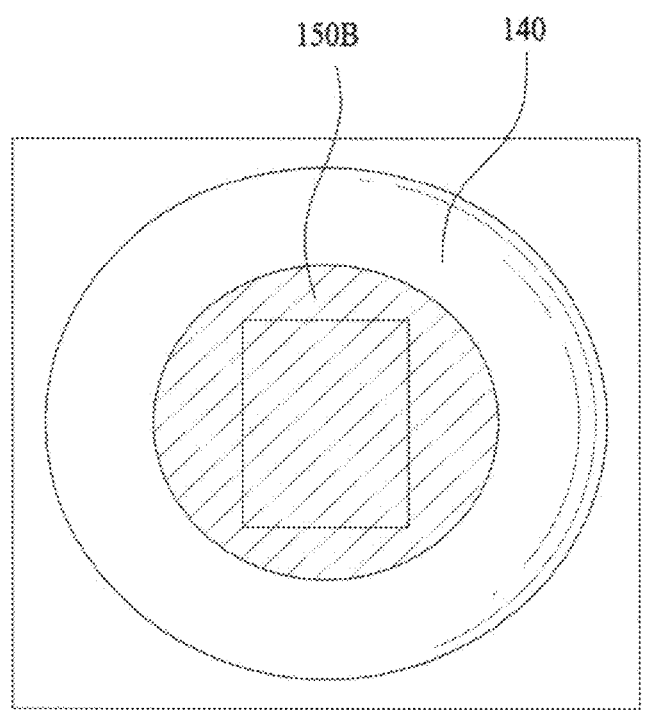
FIGS. 19A to 19C are views exemplarily showing illuminance distribution based on the size and position of the light emitting area according to another embodiment.
Figure 20A:
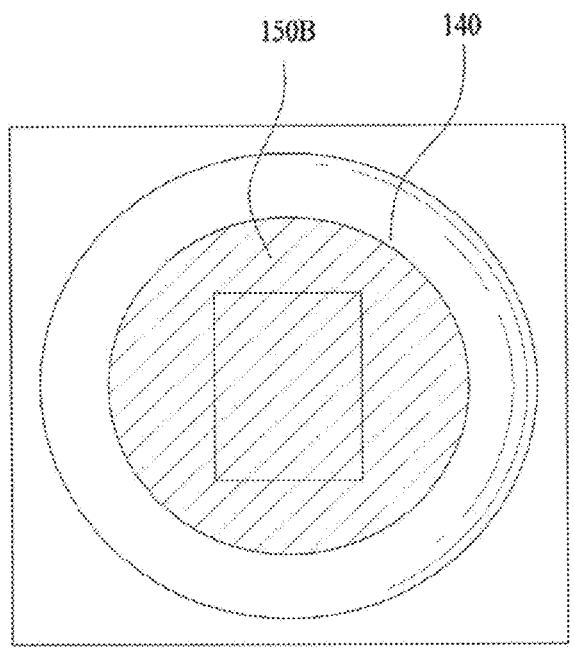
FIGS. 20A to 20C are views exemplarily showing illuminance distribution based on the size and position of the light emitting area according to another embodiment.
Figure 21A:
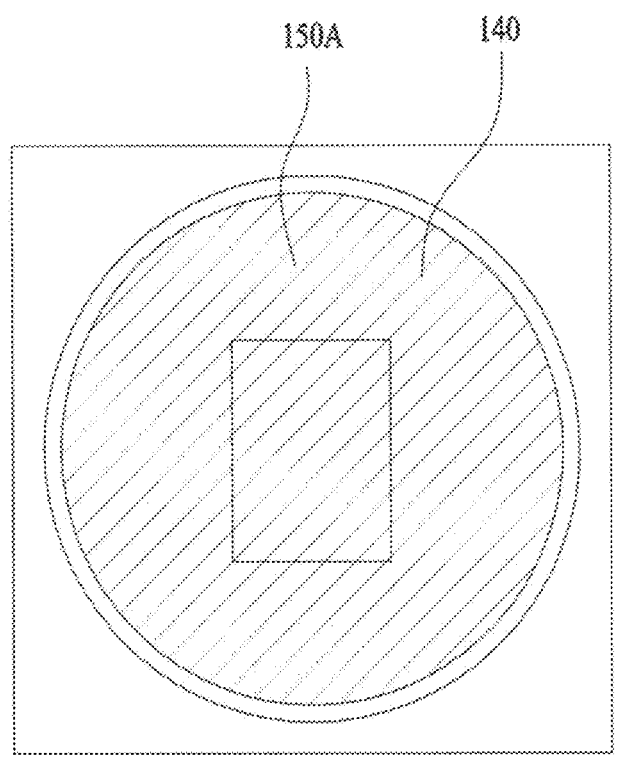
FIGS. 21A to 21C are views exemplarily showing illuminance distribution based on the size and position of the light emitting area according to a further embodiment.

FIGS. 16A, 17A, 18A, 19A, 20A, and 21A are plan views of the light emitting device packages according to the embodiments showing the size and position of the light emitting area. That is, FIG. 16A shows a case in which the wavelength conversion unit 150D is located as shown in FIGS. 9 and 10, FIG. 17A shows a case in which the wavelength conversion unit 150C is located as shown in FIGS. 7 and 8, FIGS. 18A, 19A, and 20A show a case in which the wavelength conversion unit 150B is located as shown in FIGS. 5 and 6, and FIG. 21A shows a case in which the wavelength conversion unit 150A is located as shown in FIGS. 1 and 3. The diameter of the wavelength conversion unit 150B shown in FIG. 18A may be about 1.4 mm, the diameter of the wavelength conversion unit 150B shown in FIG. 19A may be about 1.8 mm, the diameter of the wavelength conversion unit 150B shown in FIG. 20A may be about 2.2 mm, and the diameter of the wavelength conversion unit 150A shown in FIG. 21A may be about 2.8 mm.

FIGS. 16B, 17B, 18B, 19B, 20B, and 21B are sectional views of the light emitting device packages according to the embodiments showing ray-tracing based on the size and position of the light emitting area, and FIGS. 16C, 17C, 18C, 19C, 20C, and 21C show surface luminance based on the size and position of the light emitting area.

Figure 16B:
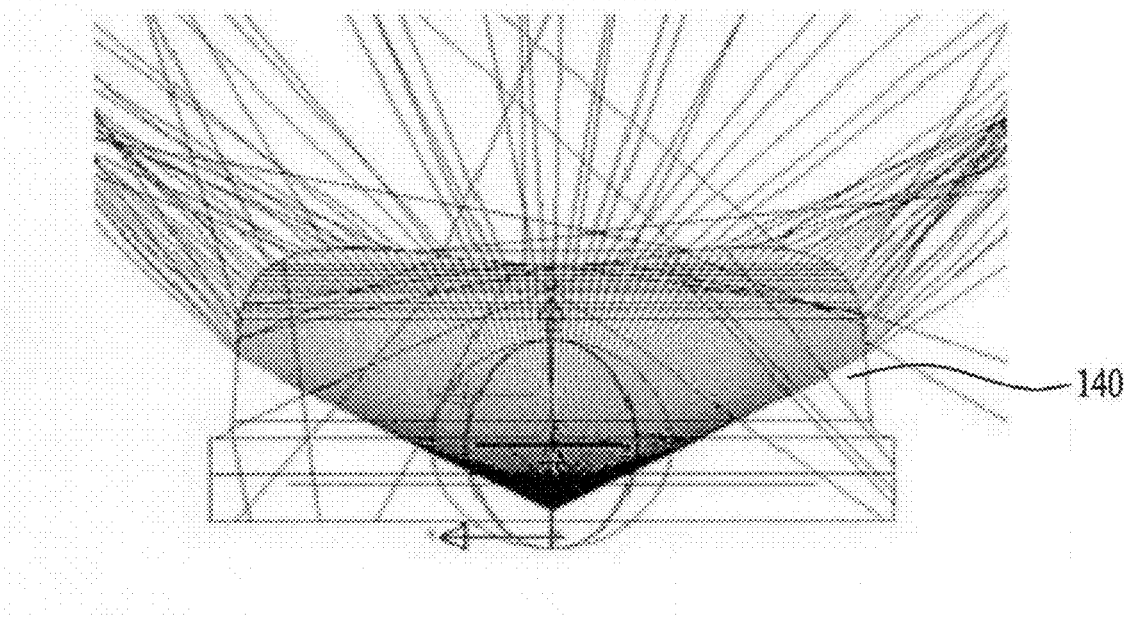
Figure 16C:
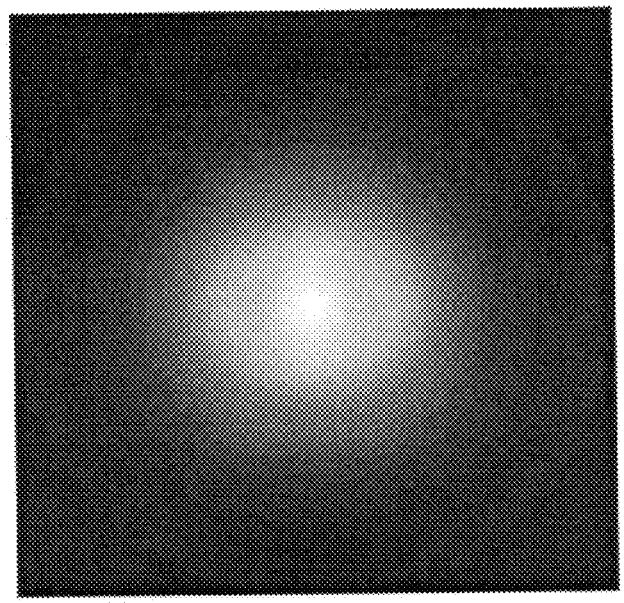
Figure 17B:
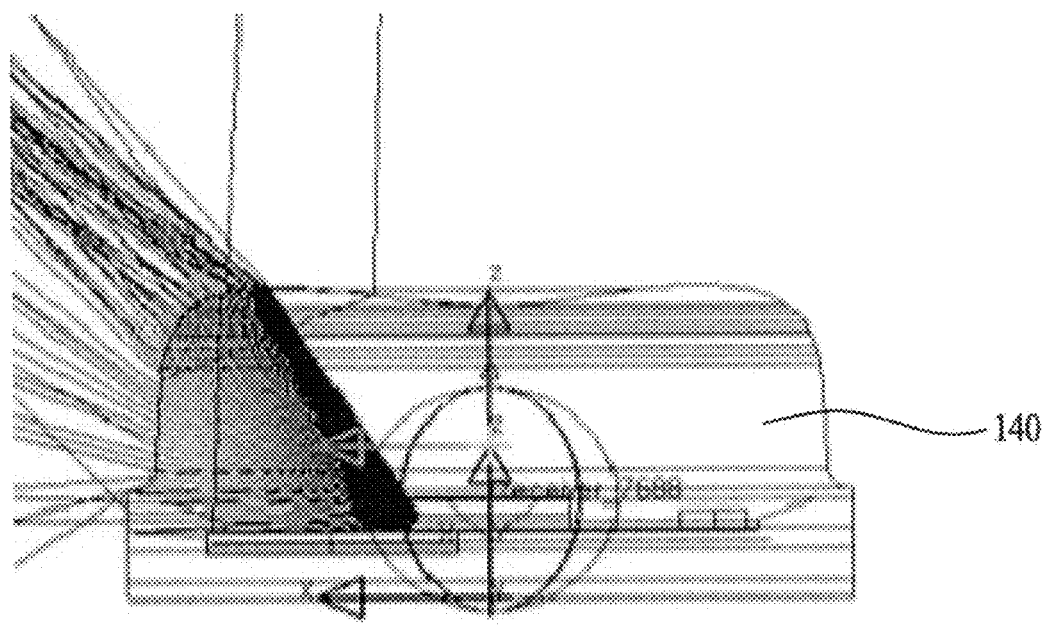
Figure 17C:
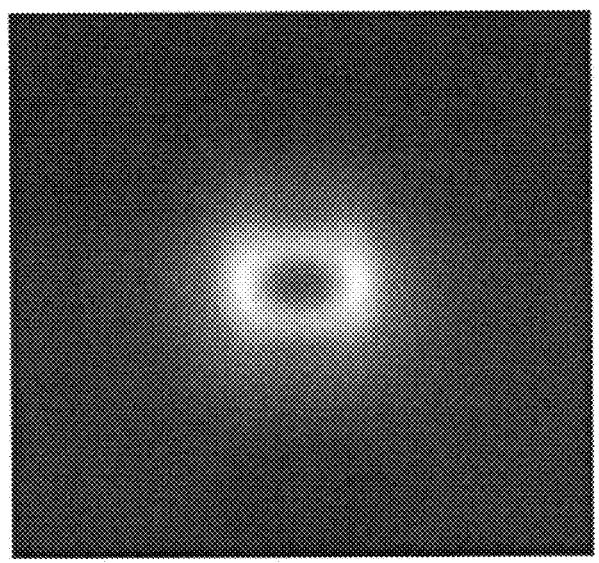
Figure 18A:
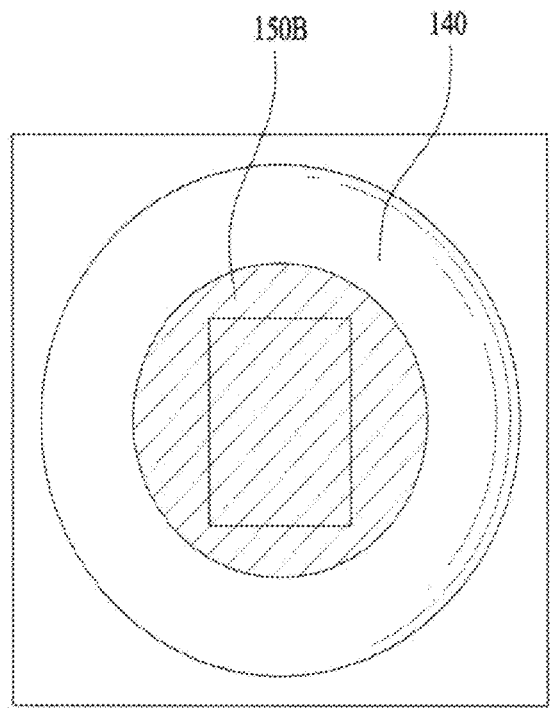
FIGS. 18A to 18C are views exemplarily showing illuminance distribution based on the size and position of the light emitting area according to another embodiment.
Figure 18B:
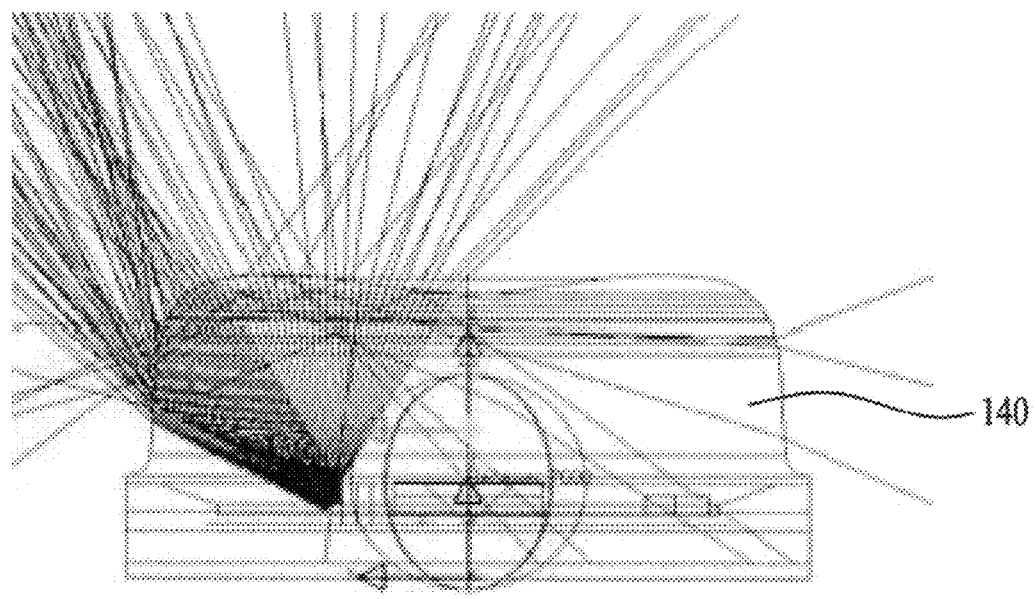
Figure 18C:
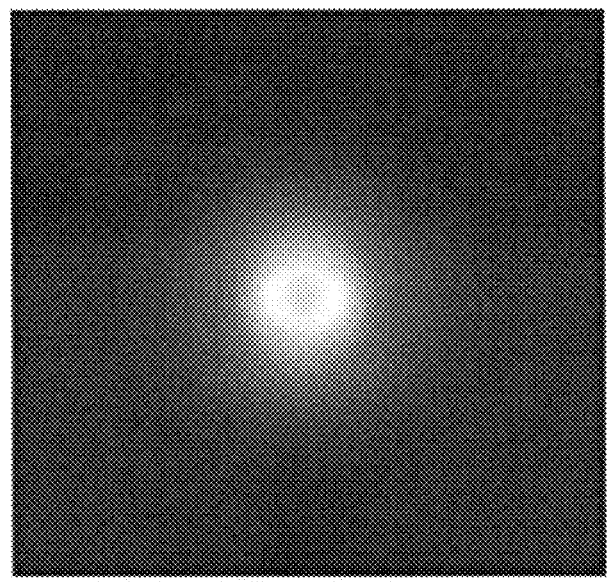
Figure 19B:
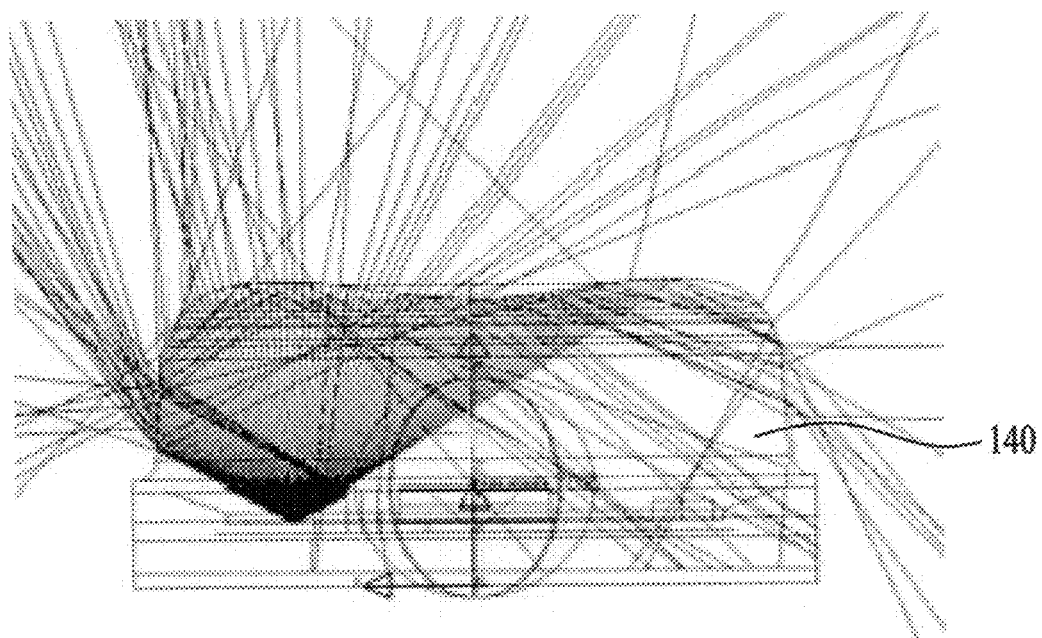
Figure 19C:
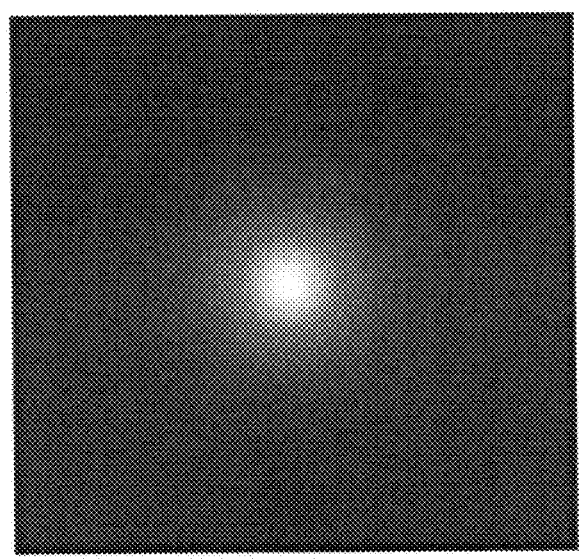
Figure 20B:
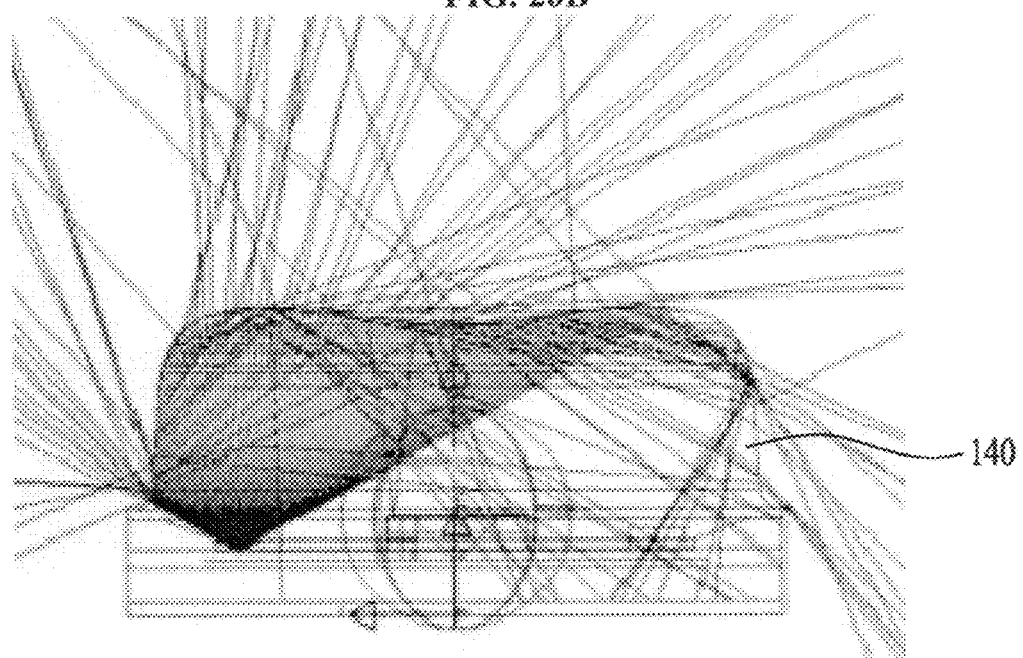
Figure 20C:
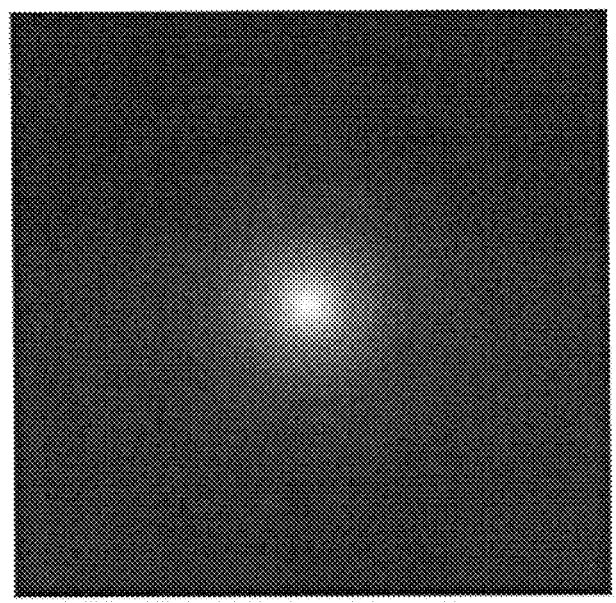
Figure 21B:
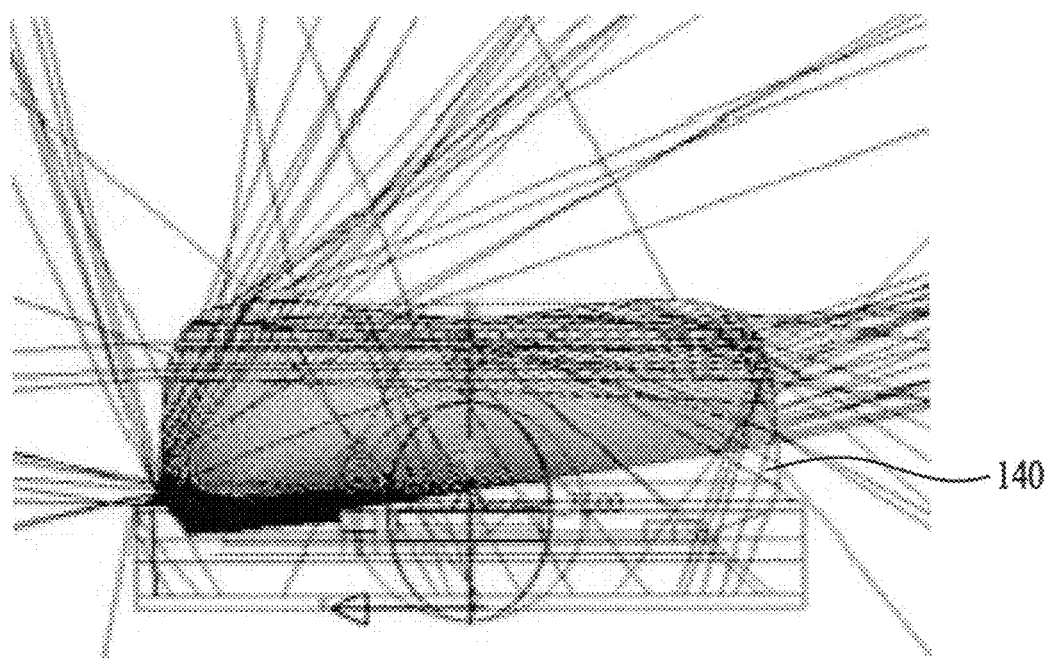
Figure 21C:
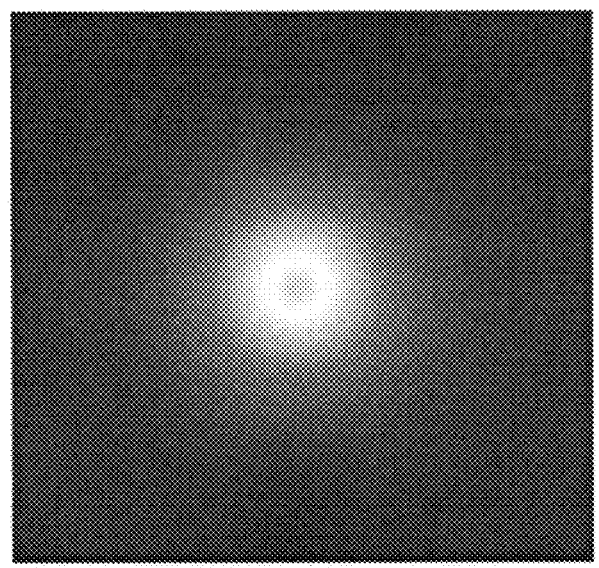

FIGS. 16B and 16C correspond to FIG. 16A, FIGS. 17B and 17C correspond to FIG. 17A, FIGS. 18B and 18C correspond to FIG. 18A, FIGS. 19B and 19C correspond to FIG. 19A, FIGS. 20B and 20C correspond to FIG. 20A, and FIGS. 21B and 21C correspond to FIG. 21A.

Referring to FIGS. 16A to 21C, it can be seen that uniformity in color distribution and uniformity of illuminance distribution of the light emitting device package are changed at the illuminance surface per angle, based on how the light emitting area is defined.

In addition, a ratio of a color distribution variation at the illuminance surface per angle of the actual area in which the wavelength conversion units 150A to 150D are actually located to a color distribution variation at the illuminance surface per angle of the total area in which the wavelength conversion units 150A to 150D can be located may be 0.001 to 0.8. When the ratio of the color distribution variation is 0.001 to 0.8, color distribution may be improved. The color distribution variation CV may be represented by Equation 1.

$$CV=\text{Max}-\text{Min} \qquad \text{[Equation 1]}$$

Where Max may indicate the maximum value of correlated color temperature (CCT), and Min may indicate the minimum value of the correlated color temperature. Alternatively, Max may indicate the maximum value of color coordinates (Cx, Cy, v, u), and Min may indicate the minimum value of the color coordinates.

As previously described, the actual area in which the wavelength conversion units 150A to 150D are located may be reduced such that the actual area is smaller than the total area, thereby improving uniformity in color distribution.

Figure 22A:
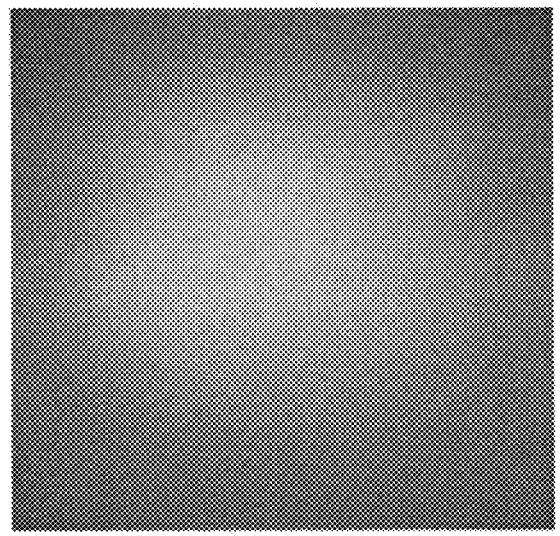
FIGS. 22A and 22B are views showing respectively color uniformity and correlated color temperature deviation when the light emitting device package according to the comparative example is actually embodied.
Figure 22B:
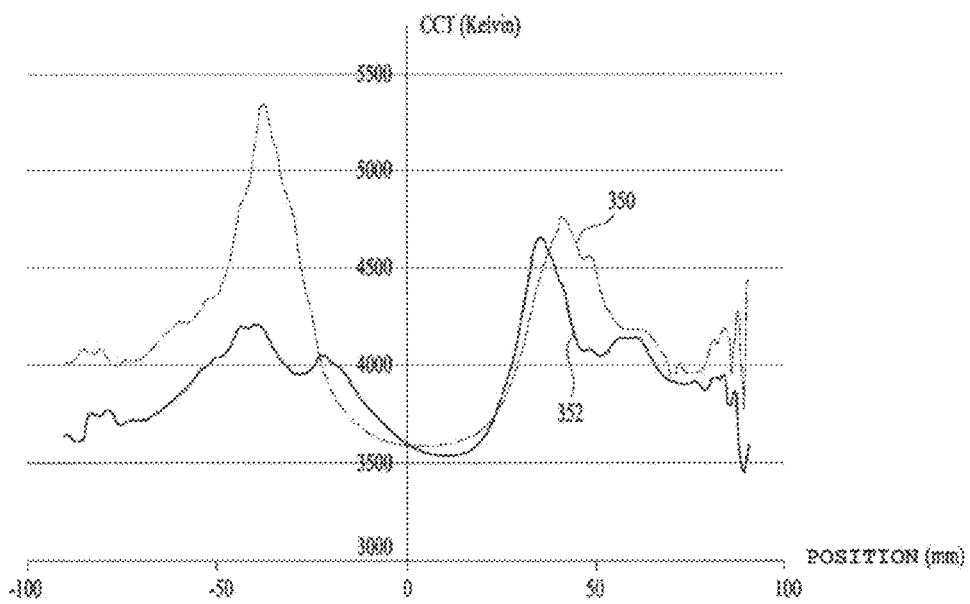
Figure 23A:
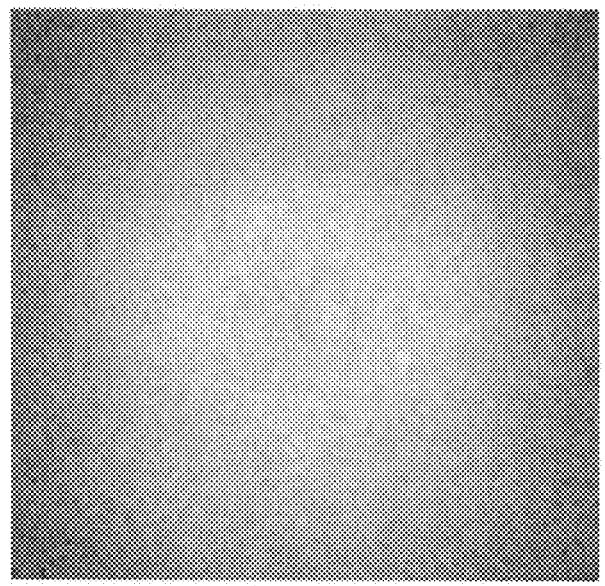
FIGS. 23A and 23B are views showing respectively color uniformity and correlated color temperature deviation when the light emitting device package according to the comparative example is theoretically simulated.
Figure 23B:
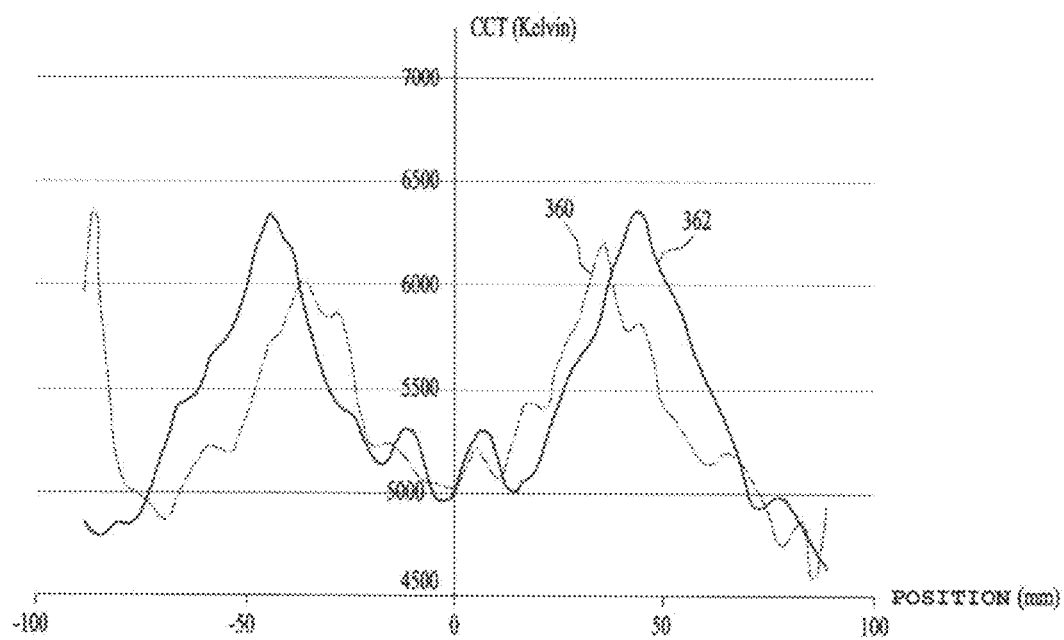

FIGS. 22A and 22B are views showing respectively color uniformity and correlated color temperature deviation ΔCCT when the light emitting device package according to the comparative example is actually embodied, and FIGS. 23A and 23B are views showing respectively color uniformity and correlated color temperature deviation ΔCCT when the light emitting device package according to the comparative example is theoretically simulated. In graphs shown in FIGS. 22B and 23B, a horizontal axis indicates the position in the y-axis direction, and a vertical axis indicates CCT. In FIGS. 22B and 23B, point 0 on the horizontal axis corresponds to a point (y=0) that the optical axis LX passes through.

Figure 24A:
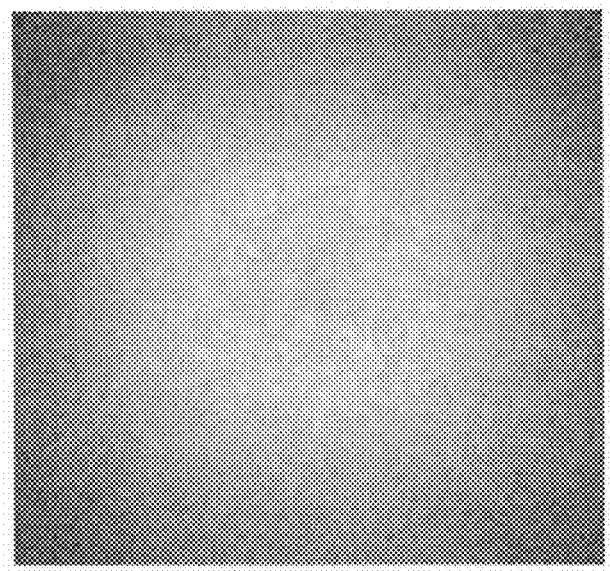
FIGS. 24A and 24B are views showing respectively color uniformity and correlated color temperature deviation of the light emitting device package shown in FIGS. 1 and 3.
Figure 24B:
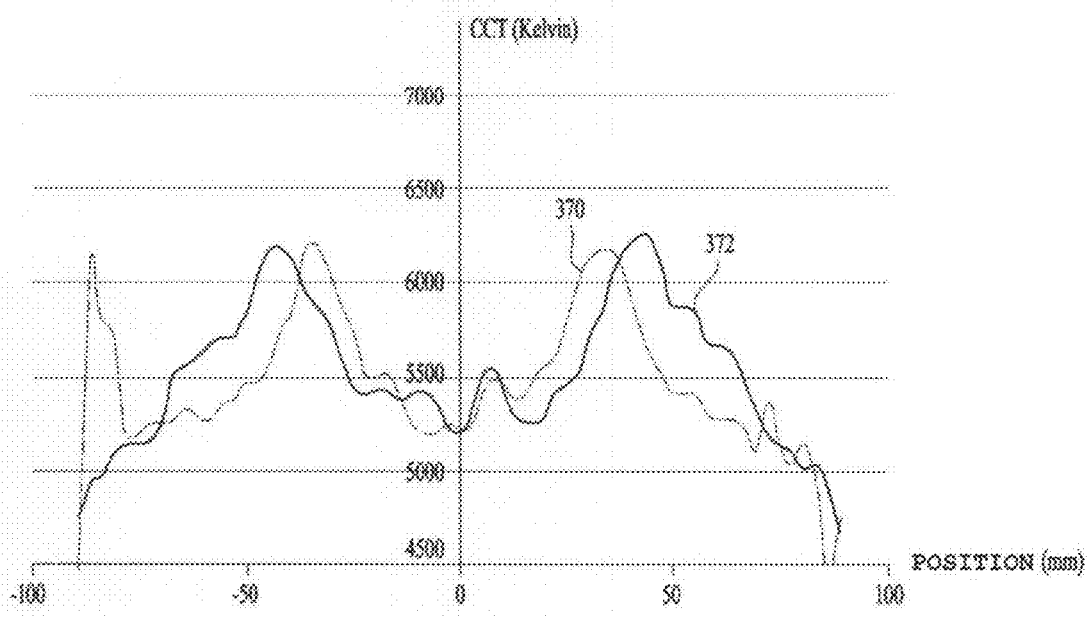
Figure 25A:
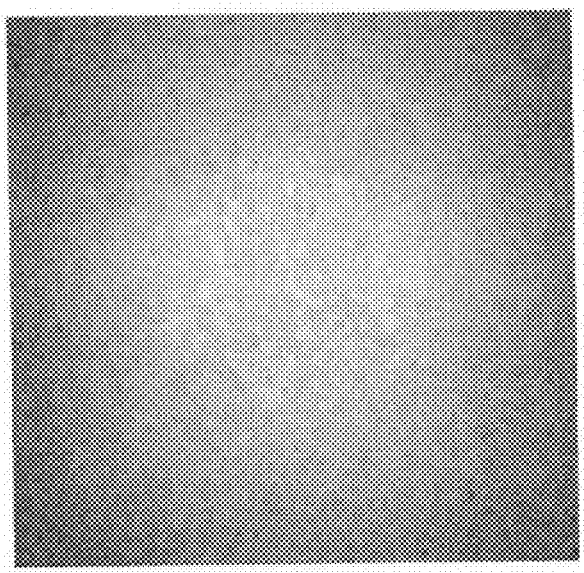
FIGS. 25A and 25B are views showing respectively color uniformity and correlated color temperature deviation of the light emitting device package shown in FIGS. 9 and 10.
Figure 25B:
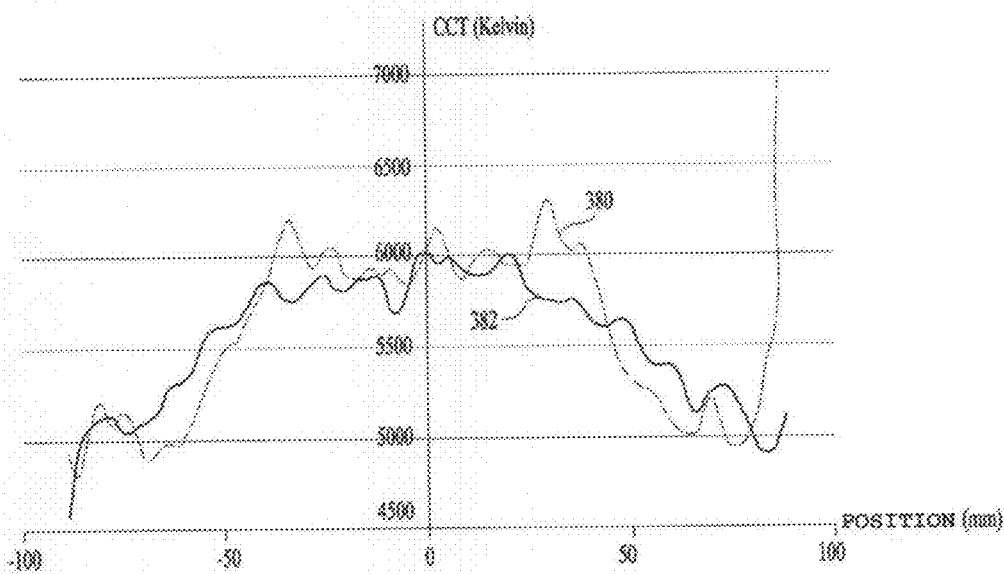

FIGS. 24A and 24B are views showing respectively color uniformity and correlated color temperature deviation ΔCCT of the light emitting device package 100A shown in FIGS. 1 and 3, and FIGS. 25A and 25B are views showing respectively color uniformity and correlated color temperature deviation ΔCCT of the light emitting device package 100D shown in FIGS. 9 and 10. In FIGS. 24B and 25B, a horizontal axis indicates the position in the y-axis direction, and a vertical axis indicates CCT. Point 0 on the horizontal axis corresponds to a point (y=0) that the optical axis LX passes through.

Reference numerals 350, 360, 370, and 380 indicate beam angles of light exiting from the sections of the light emitting device packages according to the comparative example and the embodiments when viewed in the minor-axis direction, and 352, 362, 372, and 382 indicate beam angles of light exiting from the sections of the light emitting device packages according to the comparative example and the embodiments when viewed in the major-axis direction.

In FIG. 22B, the correlated color temperature deviation ΔCCT between the CCT 350 of the light exiting from the section of the minor axis and the CCT 352 of the light exiting from the section of the major axis is 1156 K. In FIG. 23B, the correlated color temperature deviation ΔCCT between the CCT 360 of the light exiting from the section of the minor axis and the CCT 362 of the light exiting from the section of the major axis is 1280 K.

In FIG. 24B, the correlated color temperature deviation ΔCCT between the CCT 370 of the light exiting from the section of the minor axis and the CCT 372 of the light exiting from the section of the major axis is 1021 K. In FIG. 25B, the correlated color temperature deviation ΔCCT between the CCT 380 of the light exiting from the section of the minor axis and the CCT 382 of the light exiting from the section of the major axis is 784 K. It can be seen that the correlated color temperature deviations ΔCCT of the light emitting device packages according to the embodiments shown in FIGS. 24A to 25B are much smaller than the correlated color temperature deviations ΔCCT of the light emitting device package according to the comparative example shown in FIGS. 22A to 23B.

The light emitting device package according to each of the previous embodiments may be applied to various fields, such as a lighting apparatus, a display apparatus, and an indicator. For example, the lighting apparatus may be usefully used in fields, such as a linear module, a tube, a wall washer for emotional lighting, in addition to a lamp and a streetlight.

Hereinafter, a lighting apparatus including the light emitting device package according to each of the previous embodiments will be described with reference to the accompanying drawings.

Figure 26:
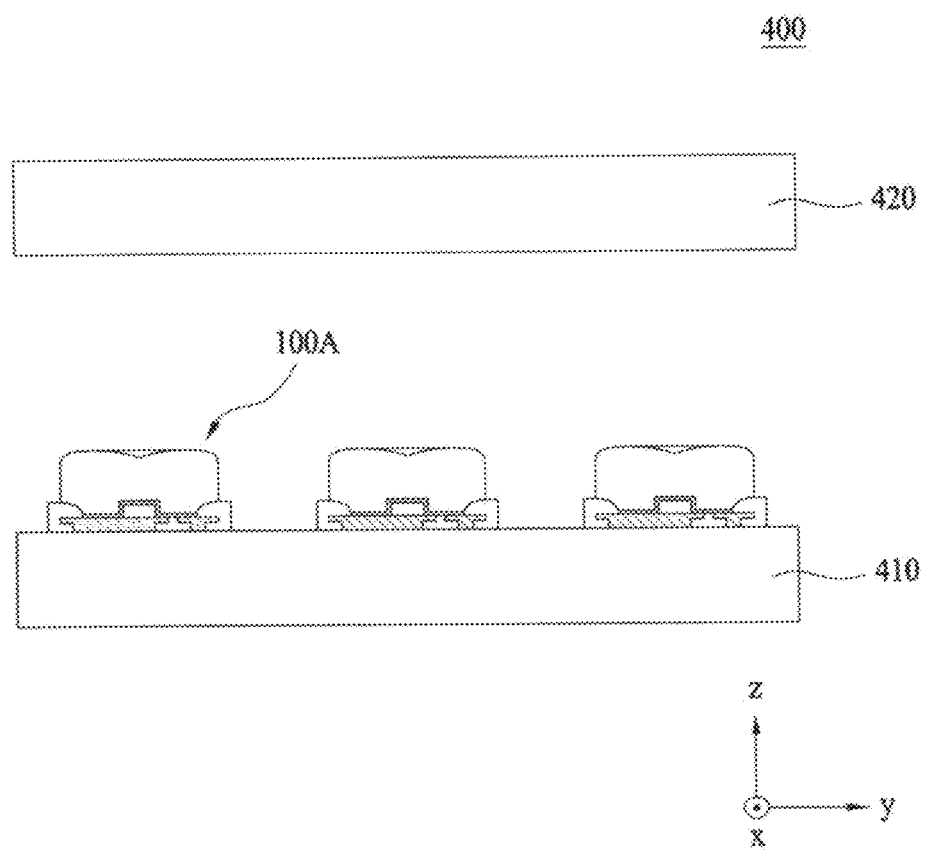
FIG. 26 is a sectional view showing a lighting apparatus according to an embodiment.

FIG. 26 is a sectional view showing a lighting apparatus 400 according to an embodiment.

Referring to FIG. 26, the lighting apparatus 400 may include a board 410, a plurality of light emitting device packages 100A, and an optical member 420.

In FIG. 26, the lighting apparatus 400 is shown as including light emitting device packages 100A, one of which is shown in FIGS. 1 to 3. However, the disclosure is not limited thereto. That is, in another embodiment, the lighting apparatus 400 may include the light emitting device packages 100B to 100D shown in FIGS. 5 to 10 in place of the light emitting device package 100A.

As shown in FIG. 26, a plurality of light emitting device packages 100A may be mounted on a board (e.g. a printed circuit board) 410 in an array fashion.

An electrode pattern for connecting each light source 130 via first and second frames 122 and 124 and an adaptor for supplying electric power may be formed on the board 410. For example, an electrode pattern for connecting the first and second frames 122 and 124 with a corresponding adaptor may be formed on the upper surface of the board 410.

The board 410 may be a printed circuit board (PCB), made of polyethylene terephthalate (PET), glass, polycarbonate (PC), or silicon (Si). The board 410 may be formed to have a film shape.

In addition, a single-layer PCB, a multiple-layer PCB, a ceramic board, or a metal core PCB may be selectively used as the board 410.

The optical member 420 may be located on the light emitting device packages 100A. The optical member 420 may serve to diffuse light exiting through the light emitting device packages 100A. In order to improve a diffusion effect, a concave and convex pattern may be formed on the upper surface of the optical member 420.

The optical member 420 may be formed to have a single layer or a plurality of layers. The concave and convex pattern may be formed on the uppermost layer or any one of the layers. The concave and convex pattern may be formed to have a stripe shape corresponding to the light emitting device packages 100A.

According to circumstances, the optical member 420 may include at least one sheet. For example, the optical member 420 may selectively include a diffusion sheet, a prism sheet, and a luminance enhancement sheet. The diffusion sheet serves to diffuse light emitted from the light emitting device packages 100A. The prism sheet serves to guide the diffused light to a light emitting area. The luminance enhancement sheet serves to enhance luminance.

As is apparent from the above description, in a light emitting device package according to an embodiment and a lighting apparatus including the same, a wavelength conversion unit is effectively located such that the number of times when light reflected in a lens collides with the wavelength conversion unit is reduced, thereby solving non-uniformity in color and non-uniformity in illuminance.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a package body;
first and second lead frames located on the package body;
a light source mounted on at least one of the first or second lead frames;
a lens located on the package body; and
a wavelength conversion unit partially located on the package body between the package body and the lens, wherein the wavelength conversion unit comprises:
   a first segment located at an upper surface of the light source; and
   a second segment extending from the first segment and located at a side surface of the light source, and
wherein the lens comprises:
   a lower recess for receiving at least a portion of the first and second segments; and
   an upper recess for reflecting and refracting light emitted from the light source and transmitted through the wavelength conversion unit.

2. The light emitting device package according to claim 1, wherein the wavelength conversion unit further comprises a third segment extending from the second segment and located between the package body and the lens.

3. The light emitting device package according to claim 2, wherein
the package body comprises a cavity, in which the light source is mounted, and the third segment is located on at least a portion of a bottom surface of the cavity excluding a side surface of the cavity.

4. The light emitting device package according to claim 3, wherein a ratio of an area in which the wavelength conversion unit is actually located to a total area in which the wavelength conversion unit can be located is equal to or greater than 0.1 and less than 1.

5. The light emitting device package according to claim 3, wherein a ratio of a color distribution variation of an area in which the wavelength conversion unit is located to a color distribution variation of a total area in which the wavelength conversion unit can be located is 0.001 to 0.8.

6. The light emitting device package according to claim 5, wherein the color distribution variation comprises a result obtained by subtracting a minimum value from a maximum value of correlated color temperature.

7. The light emitting device package according to claim 5, wherein the color distribution variation comprises a result obtained by subtracting a minimum value from a maximum value of color coordinates.

8. The light emitting device package according to claim 2, wherein the first to third segments have the same thickness.

9. The light emitting device package according to claim 2, wherein the first to third segments have different thicknesses.

10. The light emitting device package according to claim 1, wherein the wavelength conversion unit has at least one selected from among a circular planar shape, an oval planar shape, and a polygonal planar shape.

11. The light emitting device package according to claim 1, wherein the light source has an asymmetrical planar shape in a direction intersecting an optical axis.

12. The light emitting device package according to claim 11, wherein a minor-axis length of the wavelength conversion unit located in a minor-axis direction of the light source is greater than a major-axis length of the wavelength conversion unit located in a major-axis direction of the light source.

13. The light emitting device package according to claim 1, wherein the wavelength conversion unit has a planar shape symmetric with respect to an optical axis.

14. The light emitting device package according to claim 1, wherein the wavelength conversion unit is located so as to surround the light source.

15. The light emitting device package according to claim 1, wherein the wavelength conversion unit has a planar shape asymmetric with respect to an optical axis.

16. The light emitting device package according to claim 1, wherein the wavelength conversion unit comprises silicon.

17. A lighting apparatus comprising:
a light emitting device package according to claim 1; and
an optical member located on the light emitting device package.

* * * * *